US012677585B2

(12) United States Patent
Han et al.

(10) Patent No.: US 12,677,585 B2
(45) Date of Patent: Jul. 7, 2026

(54) DISPLAY DEVICE INCLUDING REINFORCEMENT AND BARRIER LAYERS

(71) Applicant: Samsung Display Co., Ltd., Yongin-si (KR)

(72) Inventors: Jihye Han, Yongin-si (KR); Eunjin Kwak, Yongin-si (KR); Chulmin Bae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 650 days.

(21) Appl. No.: 17/852,036

(22) Filed: Jun. 28, 2022

(65) Prior Publication Data

US 2023/0008950 A1      Jan. 12, 2023

(30) Foreign Application Priority Data

Jul. 12, 2021    (KR) ........................ 10-2021-0090896

(51) Int. Cl.
*H10K 77/10*        (2023.01)
*H10K 59/40*        (2023.01)
*H10K 59/80*        (2023.01)

(52) U.S. Cl.
CPC ........... *H10K 77/111* (2023.02); *H10K 59/40* (2023.02); *H10K 59/873* (2023.02)

(58) Field of Classification Search
CPC .... H10K 77/111; H10K 50/844; H10K 59/40; H10K 59/873; G09F 9/301
See application file for complete search history.

(56) References Cited

U.S. PATENT DOCUMENTS

| | | | |
|---|---|---|---|
| 9,166,191 | B2 | 10/2015 | Yoon |
| 9,184,180 | B2 | 11/2015 | Huh et al. |
| 9,305,984 | B2 | 4/2016 | Kang |
| 9,443,915 | B2 | 9/2016 | Kim et al. |
| 9,548,343 | B2 | 1/2017 | Kang |
| 9,911,918 | B2 | 3/2018 | Khachatryan et al. |
| 10,276,723 | B2 | 4/2019 | Youn et al. |
| 10,483,491 | B2 | 11/2019 | Choi et al. |
| 11,575,109 | B2 | 2/2023 | Lee et al. |

(Continued)

FOREIGN PATENT DOCUMENTS

| | | | | |
|---|---|---|---|---|
| CN | 110085657 A | * | 8/2019 | .......... H10K 50/841 |
| EP | 3006597 A1 | | 4/2016 | |

(Continued)

OTHER PUBLICATIONS

Lu, et al., "A Study on the Effects of High Temperature Thermal Cycling on Bond Strength at the Interface between BCB and PECVD SiO2 Layers," Korean Chem. Eng. Res., vol. 46, No. 2, Apr. 2008, pp. 389-396.

(Continued)

*Primary Examiner* — Ida M Soward
(74) *Attorney, Agent, or Firm* — Womble Bond Dickinson (US) LLP

(57)        ABSTRACT

A display device includes: a substrate; a reinforcement layer on the substrate; and a display layer including a barrier layer on the reinforcement layer, wherein a number of hydrogen atoms of the reinforcement layer per unit volume is less than a number of hydrogen atoms of the barrier layer per unit volume.

9 Claims, 14 Drawing Sheets

(56)                References Cited

U.S. PATENT DOCUMENTS

| | | | | |
|---|---|---|---|---|
| 11,785,799 | B2 * | 10/2023 | Kang | H10K 59/8731 |
| | | | | 257/40 |
| 11,978,803 | B2 | 5/2024 | Seo et al. | |
| 2006/0158108 | A1 * | 7/2006 | Hayashi | H10K 59/873 |
| | | | | 313/506 |
| 2011/0064932 | A1 | 3/2011 | Takahashi et al. | |
| 2011/0139747 | A1 * | 6/2011 | Lee | H10K 50/844 |
| | | | | 427/407.1 |
| 2011/0143079 | A1 * | 6/2011 | Lee | H10H 20/813 |
| | | | | 438/22 |
| 2012/0228641 | A1 | 9/2012 | Thoumazet et al. | |
| 2014/0209877 | A1 | 7/2014 | Lee et al. | |
| 2014/0319493 | A1 | 10/2014 | Lee et al. | |
| 2015/0115235 | A1 | 4/2015 | Lee et al. | |
| 2016/0141551 | A1 | 5/2016 | Seo et al. | |
| 2016/0179229 | A1 | 6/2016 | Ahn | |
| 2017/0104048 | A1 | 4/2017 | Chung et al. | |
| 2017/0323779 | A1 | 11/2017 | Um et al. | |
| 2017/0338433 | A1 | 11/2017 | Ishii et al. | |
| 2018/0090617 | A1 | 3/2018 | Youn et al. | |
| 2019/0157606 | A1 | 5/2019 | Odaka | |
| 2019/0157609 | A1 | 5/2019 | Suzuki | |
| 2019/0334120 | A1 * | 10/2019 | Seo | H10K 59/8722 |
| 2019/0393278 | A1 * | 12/2019 | Wu | G01D 5/2417 |
| 2020/0064968 | A1 * | 2/2020 | Kim | H10K 59/8792 |
| 2020/0106045 | A1 * | 4/2020 | Han | H10K 59/122 |
| 2020/0127224 | A1 | 4/2020 | Kanaya | |
| 2020/0161582 | A1 * | 5/2020 | Choi | H10K 59/40 |
| 2020/0168671 | A1 * | 5/2020 | Jang | H10K 59/131 |
| 2020/0176538 | A1 * | 6/2020 | Um | H10K 59/126 |
| 2020/0280015 | A1 | 9/2020 | Odaka | |
| 2020/0335725 | A1 | 10/2020 | Maruyama | |
| 2021/0005693 | A1 | 1/2021 | Cho et al. | |
| 2021/0143239 | A1 | 5/2021 | Kim et al. | |
| 2021/0296367 | A1 | 9/2021 | Seo et al. | |
| 2021/0320278 | A1 | 10/2021 | Chung et al. | |
| 2021/0343820 | A1 * | 11/2021 | Ming | H10K 77/111 |
| 2021/0391399 | A1 | 12/2021 | Zhao | |
| 2021/0391404 | A1 * | 12/2021 | Zhou | H10K 59/1201 |
| 2021/0408408 | A1 * | 12/2021 | Ke | H10K 77/111 |
| 2022/0005904 | A1 | 1/2022 | Moon et al. | |
| 2022/0029132 | A1 * | 1/2022 | Lee | H10K 59/40 |
| 2022/0140046 | A1 * | 5/2022 | Zhou | H10K 77/111 |
| | | | | 257/40 |
| 2024/0201743 | A1 * | 6/2024 | Wu | H10K 77/111 |

FOREIGN PATENT DOCUMENTS

| | | | | |
|---|---|---|---|---|
| EP | 3163646 | A1 | 5/2017 | |
| EP | 3683855 | A2 * | 7/2020 | H10K 59/8731 |
| EP | 3882976 | A1 | 9/2021 | |
| KR | 10-0805589 | B1 | 2/2008 | |
| KR | 10-2016-0032343 | A | 3/2016 | |
| KR | 10-2017-0106591 | A | 9/2017 | |
| KR | 10-2018-0008954 | A | 1/2018 | |
| KR | 10-2018-0033385 | A | 4/2018 | |
| KR | 10-2019-0107259 | A | 9/2019 | |
| KR | 10-2009727 | B1 | 10/2019 | |
| KR | 10-2113176 | B1 | 5/2020 | |
| KR | 10-2020-0102395 | A | 8/2020 | |
| KR | 10-2180037 | B1 | 11/2020 | |
| KR | 10-2227484 | B1 | 3/2021 | |

OTHER PUBLICATIONS

Dao, et al., "Effect of N2O/SiH4 flow ratios on properties of amorphous silicon oxide thin films deposited by inductively-coupled plasma chemical vapor deposition with application to silicon surface passivation," Vacuum 84 (2010) pp. 410-414.

US Office Action dated Jun. 2, 2025, issued in U.S. Appl. No. 17/863,353 (10 pages).

US Office Action dated Oct. 10, 2025, issued in U.S. Appl. No. 17/863,353 (9 pages).

Notice of Allowance dated Feb. 26, 2026, issued in U.S. Appl. No. 17/863,353 (9 pages).

* cited by examiner

DISPLAY DEVICE INCLUDING REINFORCEMENT AND BARRIER LAYERS

CROSS-REFERENCE TO RELATED APPLICATION

The present application claims priority to and the benefit of Korean Patent Application No. 10-2021-0090896, filed on Jul. 12, 2021, in the Korean Intellectual Property Office, the entire content of which is hereby incorporated by reference.

BACKGROUND

1. Field

Aspects of one or more embodiments relate to a display device and a method of manufacturing the display device.

2. Description of the Related Art

Mobile electronic devices have been widely used in various forms including, for example, mobile electronic devices, tablet PCs, in addition to compact electronic devices such as mobile phones, and the like.

Generally, mobile electronic devices include a display device that supports various functions and is capable of displaying visual information such as images or pictures to users. Recently, as sizes of components for driving display devices have been reduced, a ratio of a display device in an electronic device has gradually increased, and a display device with a structure that is foldable by a certain angle with respect to a flat state may be desired.

The above information disclosed in this Background section is only for enhancement of understanding of the background and therefore the information discussed in this Background section does not necessarily constitute prior art.

SUMMARY

Aspects of one or more embodiments relate to a display device and a method of manufacturing the display device.

In general, when a display device is manufactured, a substrate may be provided on a separate carrier substrate, and then, other layers are stacked on the substrate. In this case, the substrate may be damaged when the substrate is separated from the carrier substrate. In addition, when a driving driver, etc. is arranged on such a substrate, bending may occur in the substrate due to heat and pressure. One or more embodiments include a display device and a method of manufacturing the display device, wherein a substrate is not damaged or deformed when separated from a carrier substrate, and damage or deformation of the substrate is minimized or reduced even when heat and pressure are applied thereto.

Additional aspects will be set forth in part in the description which follows and, in part, will be apparent from the description, or may be learned by practice of the presented embodiments of the disclosure.

According to some embodiments, a display device includes a substrate, a reinforcement layer arranged on the substrate, and a display layer including a barrier layer on the reinforcement layer, wherein a number of hydrogen atoms of the reinforcement layer per unit volume is less than a number of hydrogen atoms of the barrier layer per unit volume.

According to some embodiments, the reinforcement layer may have a stress resistance of about 650 MPa or less.

According to some embodiments, a number of hydrogen atoms contained in the reinforcement layer per unit volume may be about $6.42 \times 10^{20}$ or less.

According to some embodiments, the reinforcement layer may include a silicon oxide.

According to some embodiments, a display device includes a substrate, a reinforcement layer arranged on the substrate, and a display layer including a barrier layer on the reinforcement layer, wherein the reinforcement layer includes a silicon nitride, and a ratio of a bond between nitrogen and hydrogen of the silicon nitride to a bond between silicon and hydrogen per unit volume is about 22 or less.

According to some embodiments, a ratio of the nitrogen to the silicon per unit volume may be about 1.1 or less.

According to some embodiments, the reinforcement layer may include a first reinforcement layer arranged on the substrate, and a second reinforcement layer arranged between the first reinforcement layer and the barrier layer.

According to some embodiments, a thickness of the reinforcement layer may be about 5,000 Å or less.

According to some embodiments, a thickness of the reinforcement layer may be less than a thickness of the barrier layer.

According to some embodiments, a method of manufacturing a display device includes forming a substrate on a carrier substrate, forming a reinforcement layer between the carrier substrate and the substrate and/or on the substrate, and forming a display layer that includes a barrier layer on the substrate, wherein a number of hydrogen atoms of the reinforcement layer per unit volume is less than a number of hydrogen atoms of the barrier layer per unit volume.

According to some embodiments, the reinforcement layer may have a stress resistance of about 650 MPa or less.

According to some embodiments, a number of hydrogen atoms contained in the reinforcement layer per unit volume may be about $6.42 \times 10^{20}$ or less.

According to some embodiments, the reinforcement layer may include a silicon oxide.

According to some embodiments, a method of manufacturing a display device includes forming a substrate on a carrier substrate, forming a reinforcement layer between the carrier substrate and the substrate and/or on the substrate, and forming a display layer that includes a barrier layer on the substrate, wherein the reinforcement layer includes a silicon nitride, and a ratio of a bond between nitrogen and hydrogen of the silicon nitride to a bond between silicon and hydrogen per unit volume is about 22 or less.

According to some embodiments, a ratio of the nitrogen to the silicon per unit volume may be about 1.1 or less.

According to some embodiments, the forming of the reinforcement layer between the carrier substrate and the substrate or on the substrate may include forming a lower reinforcement layer between the carrier substrate and the substrate.

According to some embodiments, the forming of the reinforcement layer between the carrier substrate and the substrate or on the substrate may include forming an upper reinforcement layer between the substrate and the barrier layer.

According to some embodiments, the forming of the reinforcement layer between the carrier substrate and the substrate or on the substrate may include forming the reinforcement layer a plurality of times.

According to some embodiments, a thickness of the reinforcement layer may be about 5,000 Å or less.

According to some embodiments, a thickness of the reinforcement layer may be less than a thickness of the barrier layer.

According to some embodiments, the display layer may be provided in plurality apart from each other on the substrate, and the method include separating the substrate into a plurality of substrates by cutting the substrate between the display layers adjacent to each other.

According to some embodiments, the method may further include bending the substrate.

These and/or other aspects will become apparent and more readily appreciated from the following detailed description of the embodiments, the accompanying drawings, and claims.

These general and specific aspects may be practiced using systems, methods, computer programs, or any combination of systems, methods, and computer programs.

BRIEF DESCRIPTION OF THE DRAWINGS

The above and other aspects, features, and characteristics of certain embodiments will be more apparent from the following description taken in conjunction with the accompanying drawings, in which:

FIG. 5 is a cross-sectional view illustrating a portion of a display device according to some embodiments;

DETAILED DESCRIPTION

Figure 1A:
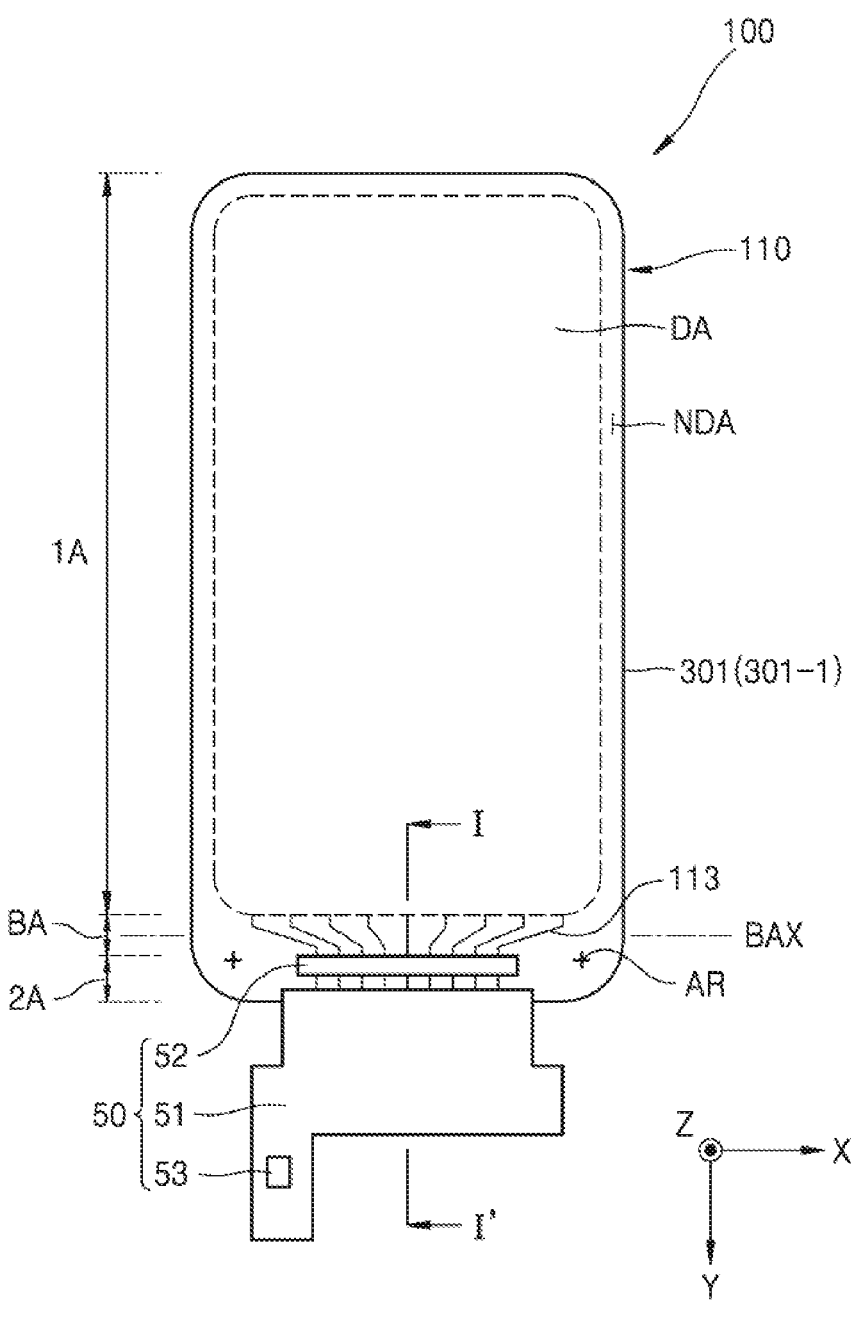
FIG. 1A is a plan view illustrating a display device according to some embodiments.

Reference will now be made in more detail to aspects of some embodiments, which are illustrated in the accompanying drawings, wherein like reference numerals refer to like elements throughout the present disclosure. In this regard, the embodiments of the present disclosure may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c"

indicates only a, only b, only c, both a and b, both a and c, both b and c, all of a, b, and c, or any variations thereof.

Embodiments according to the present disclosure may, however, be embodied in many different forms and should not be construed as being limited to the embodiments set forth herein. Characteristics and features of embodiments according to the present disclosure and methods of accomplishing the same may be understood more readily by reference to the following detailed description of embodiments and the accompanying drawings. However, the present embodiments may be implemented in various forms, and the present disclosure is not limited to the embodiments presented below.

Hereinafter, aspects of some embodiments will be described in more detail with reference to the accompanying drawings, wherein like reference numerals refer to like elements throughout the present disclosure and a repeated description thereof is omitted.

According to the present disclosure, terms such as "first" and "second" are used herein merely to describe a variety of elements, but the elements are not limited by the terms. Such terms are used only for the purpose of distinguishing one element from another element.

According to the present disclosure, an expression used in the singular encompasses the expression of the plural, unless it has a clearly different meaning in the context.

It will be understood that the terms "comprise," "comprising," "include" and/or "including" as used herein specify the presence of stated features or components but do not preclude the addition of one or more other features or components.

According to the present disclosure, it will be understood that when a component, such as a layer, a film, a region, or a plate, is referred to as being "on" another component, the component can be directly on the other component or intervening components may be present thereon.

In the drawings, sizes of components in the drawings may be exaggerated or reduced for convenience of explanation. For example, because sizes and thicknesses of elements in the drawings are arbitrarily illustrated for convenience of explanation, the present disclosure is not limited thereto.

According to the present disclosure, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When embodiments may be implemented differently, a certain process order may be performed differently from the described order. For example, two consecutively described processes may be performed substantially at the same time or performed in an order opposite to the described order. Additionally, some embodiments may include additional operations or processes or fewer operations or processes without departing from the spirit and scope of embodiments according to the present disclosure.

Figure 1B:
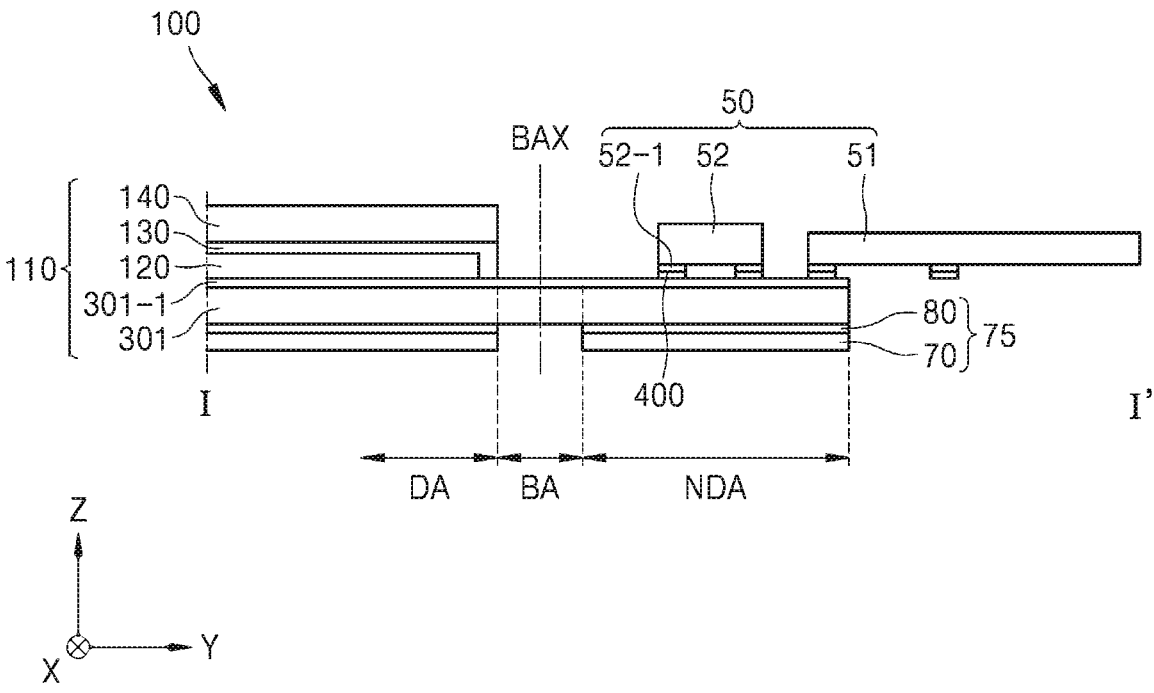
FIG. 1B is a cross-sectional view of the display device in FIG. 1A, taken along the line I-I' in FIG. 1A.

FIG. 1A is a plan view illustrating a display device 100 according to some embodiments. FIG. 1B is a cross-sectional view of the display device 100 in FIG. 1A taken along the line I-I' in FIG. 1A.

Referring to FIGS. 1A and 1B, the display device 100 may include a display panel 110, a display circuit board 51, a display driving unit (or display driver) 52, and a touch sensor driving unit (or touch sensor driver) 53. The display panel 110 may include a light-emitting display panel including a light-emitting element. For example, the display panel 110 may include an organic light-emitting display panel that uses an organic light-emitting diode including an organic emissive layer, a micro light-emitting diode (micro LED) display panel using a micro LED, a quantum dot light-emitting display panel that uses a quantum dot light-emitting diode including a quantum dot emissive layer, or an inorganic light-emitting display panel that uses an inorganic light-emitting element including an inorganic semiconductor.

The display panel 110 may include a flexible display panel that is easily bendable, foldable, or rollable. For example, the display panel 110 may include a foldable display panel that is foldable and unfoldable, a curved display panel having a curved display surface, a bended display panel of which an area other than the display surface is bent, a rollable display panel that may roll up or unrolls, and a stretchable display panel.

The display panel 110 may include a transparent display panel which is implemented to be transparent so that an object or a background arranged on a lower surface of (or behind) the display panel 110 may be visible from an upper surface (e.g., the front) of the display panel 110. In some embodiments, the display panel 110 may include a reflective display panel capable of reflecting an object or background of the upper surface of the display panel 110.

The display panel 110 may include a substrate 301 including a plurality of elements, a reinforcement layer 301-1, a display layer 120, and a thin-film encapsulation (TFE) layer 130 arranged on the display layer 120. A plurality of thin-film transistors (TFTs) and a plurality of light-emitting elements connected to the plurality of TFTs may be arranged on the substrate 301. A functional film 140 such as a polarizing plate, a touch screen, and a cover window may be arranged on the TFE layer 130. The TFE layer 130 may cover a display area DA.

The display panel 110 described above may include the display area DA for displaying images, and a peripheral area NDA arranged to surround the display area DA. A separate driving circuit, a pad, or the like may be arranged in the peripheral area NDA. In this case, the peripheral area NDA may have no images displayed therein.

In addition, the display panel 110 may include a first area 1A arranged in the display area DA, a bending area BA that is bent with respect to a bending axis BAX, and a second area 2A connected to the bending area BA and the display circuit board 51. In this case, the second area 2A and the bending area BA may be included in the peripheral area NDA, and an image may not be implemented therein.

The bending area BA, and a pad area extending beyond the bending area BA may be arranged in the peripheral area NDA. For example, the pad area may be arranged in the second area 2A. However, embodiments of the present disclosure are not limited thereto, and the bending area BA may be provided in the display area DA. According to some embodiments, the peripheral area NDA may not have the bending area BA therein and may extend to the pad area. However, hereinafter, for convenience of explanation, a case in which the peripheral area NDA includes the bending area BA and the pad area is mainly described.

Figure 2A:
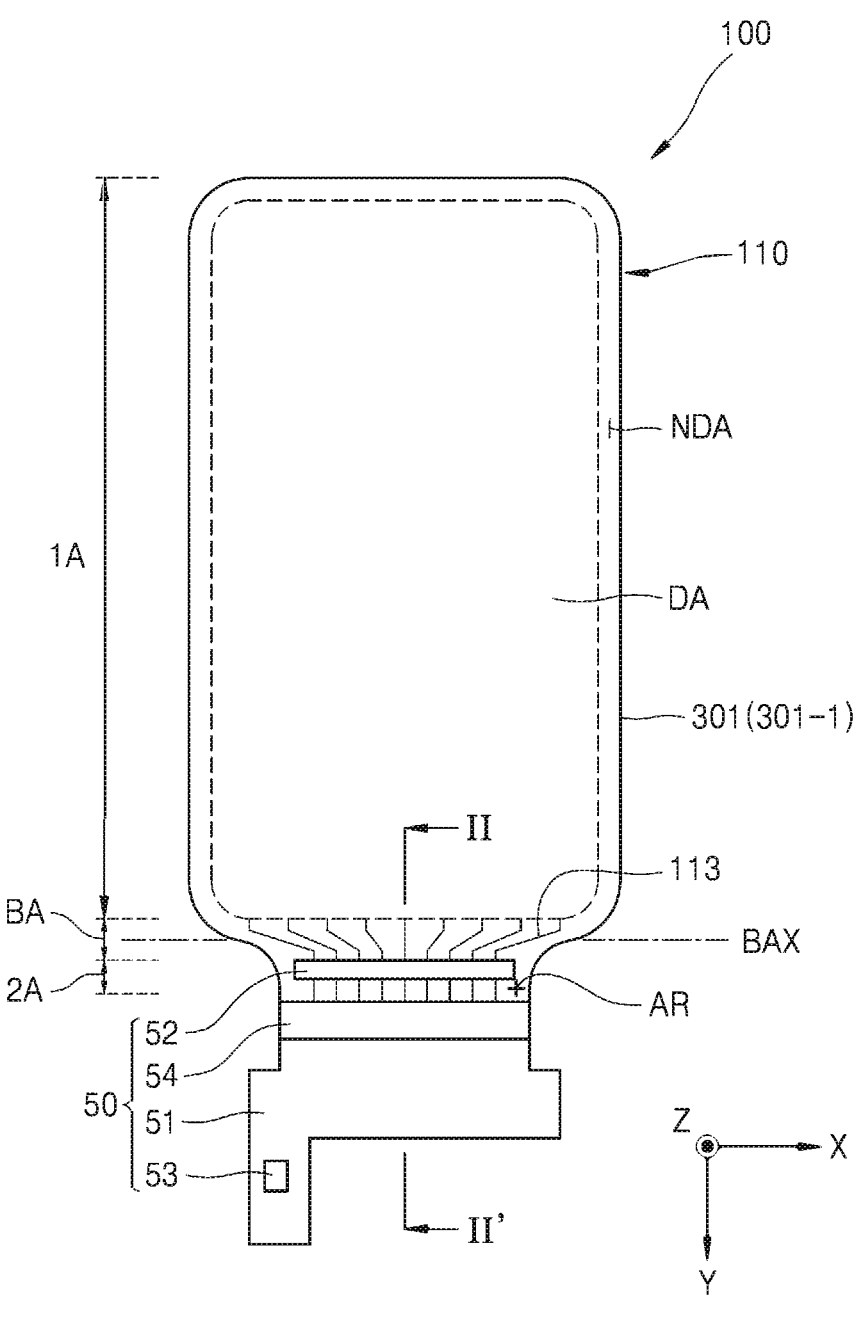
FIG. 2A is a plan view illustrating a display device according to some embodiments.

The bending area BA described above may have various shapes. According to some embodiments, as shown in FIG. 1A, the bending area BA may have a same width (for example, the width measured in an X-axis direction in FIG. 1A) as a width of the display area DA and the peripheral area NDA. According to some embodiments, as shown in FIG. 2A, the width of the bending area BA may decrease as a distance from the display area DA increases. In addition, the width of the bending area BA may be constant at a certain distance from a portion of the bending area BA connected to the display area DA. In this case, a side edge of the bending area BA may have a rounded shape.

An alignment mark AR may be arranged in the peripheral area NDA. In this case, the alignment mark AR may be arranged in the peripheral area NDA arranged in the first area 1A and/or may be arranged in the peripheral area NDA arranged in the bending area BA and/or the second area 2A. Hereinafter, for convenience of explanation, a case in which the alignment mark AR is arranged in the peripheral area NDA arranged in the second area 2A is mainly described.

The display panel 110 may be folded in one direction with respect to the bending axis BAX, which is a reference line arranged in the bending area BA. In this case, in FIG. 1A, the bending axis BAX may be arranged in the bending area BA and may be arranged in the X-axis direction. However, embodiments of the present disclosure are not limited thereto, and the display area DA and the pad area may be connected to each other even without the bending area BA. In other words, the display panel 110 may also be configured such that the substrate 301 is arranged on one flat surface without the bending axis BAX. However, for convenience of explanation, the display panel 110 that is foldable in one direction with respect to a bending line is mainly described below.

The pad area may be arranged at one edge of the substrate 301. A plurality of pad terminals 400 may be arranged in the pad area. The plurality of pad terminals 400 may be arranged apart from each other in the X-axis and Y-axis directions of the substrate 301. The pad terminals 400 may be connected to a line 113 extending from the display area DA.

The display panel 110 may be connected to a driving unit 50. In this case, the plurality of pad terminals 400 may be electrically connected to the driving unit 50.

The driving unit 50 may include a driving circuit and a chip on plastic (COP). However, the driving unit 50 is not limited thereto, and may include, for example, a chip on film (COF) or a chip on glass (COG). Hereinafter, for convenience of explanation, a case in which the driving unit 50 includes a COP is mainly described.

The driving unit 50 may include the display driving unit 52 arranged on the substrate 301, a plurality of driving terminals 52-1 arranged below the display driving unit 52, and the display circuit board 51 electrically connected to the display driving unit 52. The display circuit board 51 may include a flexible printed circuit board (FPCB).

The display circuit board 51 may be attached to a side edge of the display panel 110. A side of the display circuit board 51 may be attached to the side edge of the display circuit board 51 by using an anisotropic conductive film.

The display driving unit 52 may be arranged in the second area 2A of the substrate 301. The display driving unit 52 may receive control signals and power voltages and generate and output signals and voltages to drive the display driving unit 52. The display driving unit 52 may include an integrated circuit (IC). In this case, the plurality of pad terminals 400 and the plurality of driving terminals 52-1 may be electrically connected to each other. In other words, the pad terminal 400 and the driving terminal 52-1, which are arranged to correspond to each other, may be electrically connected to each other in a direct or indirect manner.

The display circuit board 51 may be attached to the display panel 110. In this case, the display circuit board 51 and the display panel 110 may be attached to each other by using an anisotropic conductive film. The display circuit board 51 may include an FPCB that is bendable, a rigid printed circuit board (PCB) that is rigid and not easily bent, and a complex PCB including both the rigid PCB and the FPCB.

The touch sensor driving unit 53 may be arranged on the display circuit board 51. The touch sensor driving unit 53 may include an IC. The touch sensor driving unit 53 may be attached onto the display circuit board 51. The touch sensor driving unit 53 may be electrically connected to touch electrodes of a touch screen layer of the display panel 110 through the display circuit board 51.

A touch screen layer of the display panel 110 may detect a touch input of a user by using at least one of various touch methods including a resistive layer method, a capacitive method, and the like. For example, when the touch screen layer of the display panel 110 uses the capacitive method to detect the touch input of the user, the touch sensor driving unit 53 transmits driving signals to driving electrodes among the touch electrodes, and determines voltages charged to a mutual capacitance between the driving electrodes through sensing electrodes among the touch electrodes, thereby determining whether the user's touch is input. The touch of the user may include a contact touch and a proximity touch. The contact touch refers to direct contact by a user's finger or an object such as a pen with a cover member arranged on the touch screen layer 141. The proximity touch refers to an object such as a user's finger or a pen being positioned close to but away from the cover member, such as hovering. The touch sensor driving unit 53 transmits sensor data to a main processor based on the detected voltages, and the main processor analyzes the sensor data to calculate touch coordinates at which the touch input occurs.

The display driving unit (or display driver) 52 for applying driving voltages for driving pixels of the display panel 110, a scan driving unit (or scan driver), and a power supply unit (or power supply) may be further arranged on the display circuit board 51. In some embodiments, the power supply unit may be combined with the display driving unit 52, in which case the display driving unit 52 and the power supply unit may be provided as a single integrated circuit (IC) or chip.

Figure 2B:
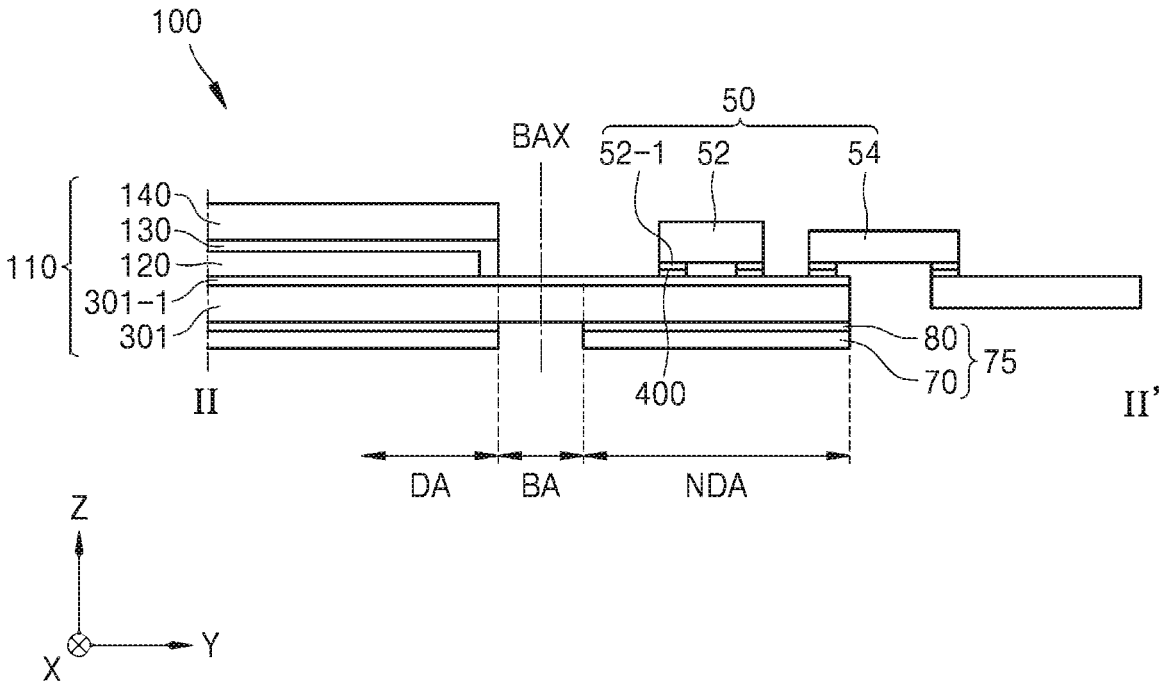
FIG. 2B is a cross-sectional view of the display device in FIG. 2A, taken along the line II-II' in FIG. 2A.

FIG. 2A is a plan view illustrating a display device 100 according to some embodiments. FIG. 2B is a cross-sectional view of the display device 100 in FIG. 2A taken along the line II-II' in FIG. 2A.

Referring to FIGS. 2A and 2B, the display device 100 may include a display panel 110, a display circuit board 51, a display driving unit 52, a touch sensor driving unit 53, and a flexible film 54. In this case, the display panel 110, the display driving unit 52, and the touch sensor driving unit 53 may be similar to those described with reference to FIG. 1A.

The display panel 110 may include a display area DA and a peripheral area NDA, and may include a first area 1A in which the display area DA is located, a bending area BA that is bendable, and a second area 2A connected to the bending area BA. In this case, a length of the bending area BA connected to the first area 1A may be less than a length of a side of the first area 1A. In other words, a width of the bending area BA measured in the X-axis direction in FIG. 2A may decrease as it progresses toward the second area 2A from the first area 1A, but may be constant in a certain area. In this case, a pad area may be arranged in the second area 2A. In addition, an alignment mark AR may be arranged in the peripheral area NDA.

The display panel 110 described above may include a substrate 301, a reinforcement layer 301-1, a display layer 120, a TFE layer 130, and a functional film 140. The substrate 301, the reinforcement layer 301-1, the display layer 120, the TFE layer 130, and the functional film 140 are the same as or similar to those described with reference to FIGS. 1A and 1B, and some redundant descriptions thereof may be omitted.

The flexible film 54 may be attached to an edge at a side of the display panel 110. One side of the flexible film 54 may be attached to a side edge of the display panel 110 by using an anisotropic conductive film. The flexible film 54 may include a bendable flexible film. The display driving unit 52 may be arranged on the substrate 301.

The display circuit board 51 may be attached to another side of the flexible film 54. The other side of the flexible film 54 may be attached to an upper surface of the display circuit board 51 by using an anisotropic conductive film. The display circuit board 51 may include an FPCB that is bendable, a rigid PCB that is rigid and not easily bent, or a complex PCB including both the rigid PCB and the FPCB.

In this case, a plurality of pad terminals 400 may be electrically connected to a driving unit 50. The driving unit 50 may include a driving circuit and a COP. However, the driving unit 50 is not limited thereto, and may include, for example, a COF or a COG. Hereinafter, for convenience of explanation, a case in which the driving unit 50 includes the COP is mainly described.

The driving unit 50 may include the flexible film 54 on which a circuit line is patterned, the display driving unit 52 arranged on the substrate 301, and a plurality of driving terminals 52-1 arranged below the display driving unit 52. The flexible film 54 and the display driving unit 52 may be electrically connected to each other.

The flexible film 54 may be electrically connected to the display circuit board 51. The display circuit board 51 may include an FPCB.

The plurality of pad terminals 400 and the plurality of driving terminals 52-1 may be electrically connected to each other in a direct or indirect manner. In other words, the pad terminal 400 and the driving terminal 52-1, which are arranged to correspond to each other, may be electrically directly connected to each other.

In FIGS. 1A and 2A, the bending area BA is located in the substrate 301, but embodiments are not limited thereto. For example, in FIG. 1A, the first area 1A may refer to an entire display panel 110, and the bending area BA and the second area 2A may be located in the display circuit board 51. In this case, a portion of the display circuit board 51 may form a flat surface with the display panel 110, and another portion of the display circuit board 51 may be fixed to another side of the display panel 110 on which the display circuit board 51 is not arranged. In addition, in FIG. 2A, the first area 1A refers to the entire display panel 110 and a portion of the flexible film 54, and the second area 2A may refer to the other portion of the flexible film 54 and the display circuit board 51. In this case, the bending area BA may be arranged in the flexible film 54, and a bending axis BAX may be arranged in the flexible film 54 and bent with respect to the bending axis BAX. In this case, the entire display circuit board 51 may be fixed onto a side of the display circuit board 51 on which the display area DA is not arranged.

Figure 3:
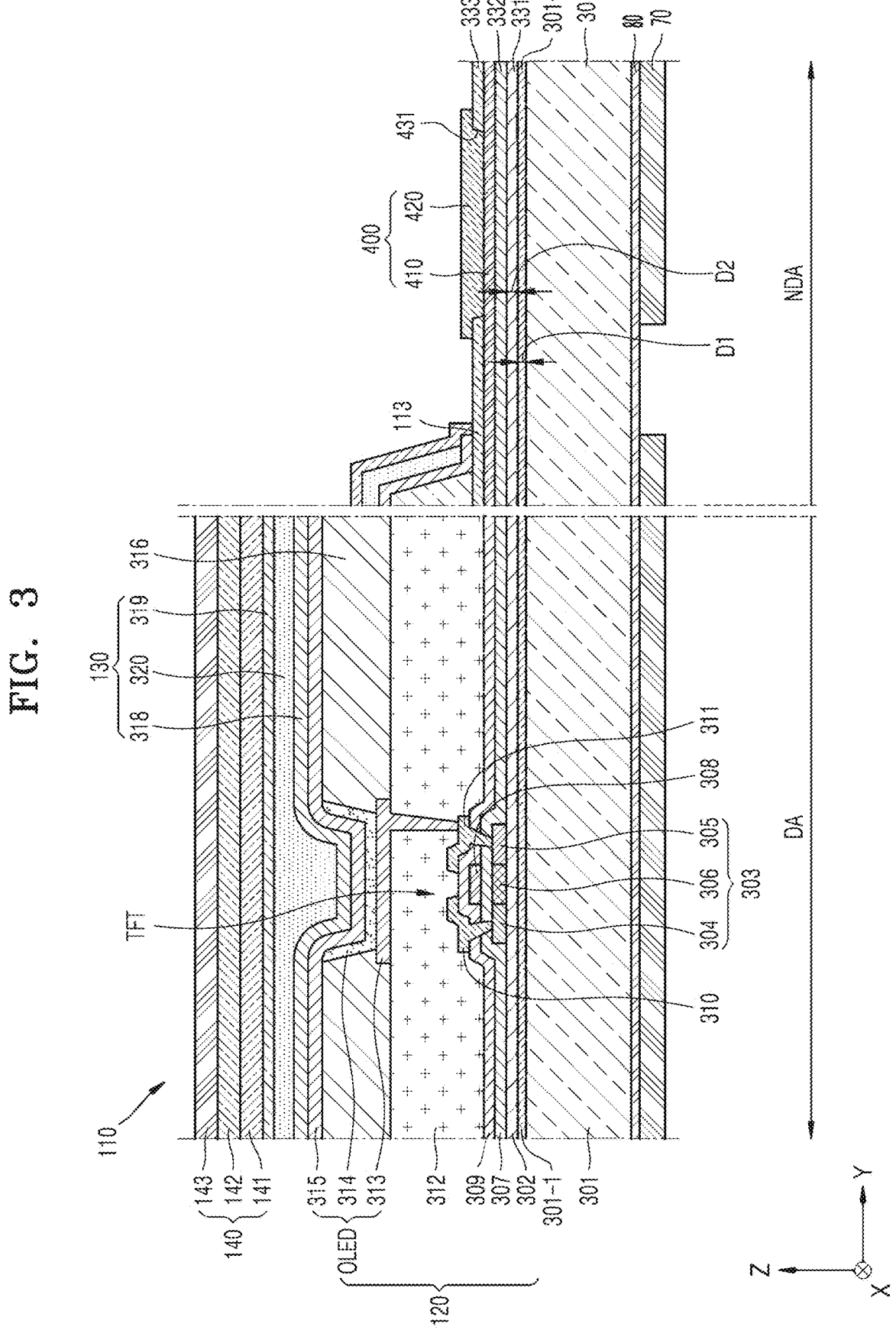
FIG. 3 is a cross-sectional view illustrating a portion of the display device shown in FIG. 1A or 2A.

FIG. 3 is a cross-sectional view illustrating a portion of the display device shown in FIG. 1A or 2A.

Referring to FIG. 3, a substrate 301 may include a flexible polymer substrate or a rigid polymer substrate. The substrate 301 may be transparent, translucent, or opaque. In this case, the substrate 301 may include polyimide (PI) and may include a single layer.

A reinforcement layer 301-1 may be arranged on the substrate 301. The reinforcement layer 301-1 may include silicon oxide ($SiO_X$) and/or silicon nitride ($SiN_X$). In this case, the reinforcement layer 301-1 may be provided by a chemical vapor deposition method.

When the reinforcement layer 301-1 as described above includes a $SiO_X$, the reinforcement layer 301-1 may have a smaller number of hydrogen atoms per unit volume (for example, 1 cm³) compared to a barrier layer 302 to be described later. For example, the number of hydrogen atoms included in the unit volume of the reinforcement layer 301-1 may be less than. $6.42 \times 10^{20}$ On the other hand, a number of hydrogen atoms included in the unit volume of the barrier layer 302 may exceed. $6.42 \times 10^{20}$ When the number of hydrogen atoms per unit volume of the reinforcement layer 301-1 exceeds, $6.42 \times 10^{20}$ a layer density of a layer of the reinforcement layer 301-1 is lowered, and thus, the reinforcement layer 301-1 may be relatively easily damaged. In other words, as described above, as the number of hydrogen atoms contained in the reinforcement layer 301-1 decreases, stress of the reinforcement layer 301-1 may have a compressive force. In this case, because the stress inherent in the substrate 301 is generally a tensile force, which may be offset, and thus, an overall stress of the display panel 110 may be close to zero.

When the reinforcement layer 301-1 includes a $SiO_X$, the stress of the reinforcement layer 301-1 may have a value of −650 MPa or less. In this case, when the stress has a negative value, it means that the reinforcement layer 301-1 has a compressive force, and when the stress has a positive value, it means that the reinforcement layer 301-1 has a tensile force. In the above case, when the stress of the reinforcement layer 301-1 exceeds −650 MPa and the barrier layer 302 is provided on the reinforcement layer 301-1, the barrier layer 302 may be separated from the reinforcement layer 301-1 or the barrier layer 302 may be lifted from the reinforcement layer 301-1, and thus, a defect may occur in the manufacturing process. Furthermore, the reinforcement layer 301-1 as described above may provide a compressive force, thereby reducing the overall stress of the display panel 110 to 0.

The reinforcement layer 301-1 includes $SiN_X$, a ratio between silicon-hydrogen bonds and nitrogen-hydrogen bonds of $SiN_X$ per unit volume (1 cm³) may be about 22 or less. In other words, [N—H]/[Si—H] ratio may be 22. In this case, the transfer of external heat to the substrate 301 may be minimized or reduced by increasing the density of the reinforcement layer 301-1.

When the reinforcement layer 301-1 includes a $SiN_X$, a ratio of silicon to nitrogen of the $SiN_X$ per unit volume (1 cm³) may be about 1.1 or less. In other words, the N/Si composition ratio may be ≤1.1. Also in this case, the density of the reinforcement layer 301-1 may increase, so that a heat blocking efficiency may be increased, and the reinforcement layer 301-1 may be provided to have compressive force.

The display layer 120 may be arranged on the reinforcement layer 301-1 described above. In this case, the display layer 120 may mean from the barrier layer 302 to a second electrode 315.

The barrier layer 302 may be arranged on the reinforcement layer 301-1. The barrier layer 302 may cover an upper surface of the substrate 301. The barrier layer 302 may include an organic layer or an inorganic layer. In addition, the barrier layer 302 may include a single layer or multiple layers. Hereinafter, for convenience of explanation, a case in which the barrier layer 302 includes a single inorganic layer is mainly described in detail. In particular, a case in which the barrier layer 302 includes a $SiO_X$ is described in detail.

The reinforcement layer 301-1 may have a first thickness D1 of about 5000 Å or less. In this case, when the first thickness D1 of the reinforcement layer 301-1 is greater than about 5,000 Å, an excessive compressive force is applied to the display panel 110 so that an overall stress of the display panel 110 has a compressive force, thereby deteriorating flatness of the display panel 110 after the display panel 110 is manufactured. A second thickness D2 of the barrier layer 302 may be greater than or equal to the first thickness D1 of the reinforcement layer 301-1.

At least one thin-film transistor TFT may be arranged in the display area DA. According to some embodiments, a number of the thin-film transistors TFT may not be limited to any number.

A semiconductor active layer 303 may be arranged on the barrier layer 302. The semiconductor active layer 303 may include a source area 304 and a drain area 305 arranged by doping n-type impurity ions or p-type impurity ions. Between the source area 304 and the drain area 305 may include a channel area 306 that is not doped with impurities. The semiconductor active layer 303 may include an organic semiconductor, an inorganic semiconductor, or amorphous silicon. According to some embodiments, the semiconductor active layer 303 may include an oxide semiconductor.

A gate insulating layer 307 may be deposited on the semiconductor active layer 303. The gate insulating layer 307 may include an organic layer and/or an inorganic layer. In addition, the gate insulating layer 307 may include a single layer or multiple layers including at least one of an organic layer or an inorganic layer. In this case, the gate insulating layer 307 is not limited thereto and may be modified in various shapes.

A gate electrode 308 may be arranged on the gate insulating layer 307. The gate electrode 308 may include a metal material having conductivity. For example, the gate electrode 308 may include at least one of molybdenum (Mo), aluminum (Al), copper (Cu), or titanium (Ti). The gate electrode 308 may include a single layer and/or multiple layers including at least one of Mo, Al, Cu, or Ti. In this case, the gate electrode 308 is not limited thereto and may be modified into various materials and various shapes.

An interlayer insulating layer 309 may be arranged on the gate electrode 308. The interlayer insulating layer 309 may include an organic layer or an inorganic layer.

A source electrode 310 and a drain electrode 311 may be arranged on the interlayer insulating layer 309. A contact hole may be provided by removing a portion of the gate insulating layer 307 and a portion of the interlayer insulating layer 309, and the source electrode 310 may be electrically connected to the source area 304 and the drain electrode 311 may be electrically connected to the drain area 305 through the contact hole.

The source electrode 310 and the drain electrode 311 may each include a metal material having excellent conductivity. For example, the source electrode 310 and the drain electrode 311 may each include at least one of Mo, Al, Cu, or Ti. Each of the source electrode 310 and the drain electrode 311 may include a single layer or multiple layers including at least one of Mo, Al, Cu, or Ti. For example, each of the source electrode 310 and the drain electrode 311 may each include a stacked structure of a Ti layer, an Al layer, and another Ti layer. In this case, at least one of the source electrode 310 or the drain electrode 311 is not limited thereto, and may include various materials and various structures.

A protective layer 312 may be arranged on the source electrode 310 and the drain electrode 311. The protective layer 312 may include an organic layer or an inorganic layer. The protective layer 312 may include a passivation layer or a planarization layer. Either one of the passivation layer and the planarization layer may be omitted.

The thin-film transistor TFT may be electrically connected to an organic light-emitting display device OLED.

The organic light-emitting display device OLED may be arranged on the protective layer 312. The organic light-emitting display device OLED may include a first electrode 313, an intermediate layer 314, and the second electrode 315.

The first electrode 313 may function as an anode electrode and may include various conductive materials. The first electrode 313 may include a transparent electrode or a reflective electrode. For example, when the first electrode 313 is used as the transparent electrode, the first electrode 313 may include a transparent conductive layer. When the first electrode 313 is used as the reflective layer, the first electrode 313 may include a reflective layer and a transparent conductive layer arranged on the reflective layer. According to some embodiments, the first electrode 313 may have a stacked structure of indium tin oxide (ITO)/silver (Ag)/ITO.

The first electrode 313 as described above may be connected to the drain electrode 311 or the source electrode 310. Hereinafter, for convenience of explanation, a structure in which the first electrode 313 is connected to the drain electrode 311 is mainly described.

A pixel-defining layer 316 may be arranged on the protective layer 312. The pixel-defining layer 316 may cover a portion of the first electrode 313. The pixel-defining layer 316 may surround an edge of the first electrode 313 to define an emission area of each sub-pixel. The first electrode 313 may be patterned for each sub-pixel. The pixel-defining layer 316 may include an organic layer and/or an inorganic layer. The pixel-defining layer 316 may include a single layer or multiple layers including at least one of an organic layer or an inorganic layer. In this case, the pixel-defining layer 316 is not limited thereto and may include various materials and various shapes.

The intermediate layer 314 may be arranged on the first electrode 313 in an area exposed by etching a portion of the pixel-defining layer 316. The intermediate layer 314 may be provided by a deposition process.

The intermediate layer 314 may include an organic emissive layer.

According to some embodiments, the intermediate layer 314 may include an organic emissive layer and may further include at least one of a hole injection layer (HIL), a hole transport layer (HTL), an electron transport layer (ETL), or an electron injection layer (EIL).

According to some embodiments, the intermediate layer 314 may include an organic emissive layer and may further include other various functional layers.

The second electrode 315 may be arranged on the intermediate layer 314.

The second electrode 315 may function as a cathode electrode. The second electrode 315 may include a transparent electrode or a reflective electrode. For example, when the second electrode 315 is used as a transparent electrode, the second electrode 315 may include a metal layer and a transparent conductive layer arranged on the metal layer. When the second electrode 315 is used as a reflective layer, the second electrode 315 may include a metal layer.

According to some embodiments, a plurality of sub-pixels may be provided on the substrate 301. For example, each of the sub-pixels may implement red, green, blue or white light. However, embodiments according to the present disclosure are not limited thereto.

A TFE layer 130 may cover the organic light-emitting display device OLED.

In the TFE layer 130, a first inorganic layer 318, a second inorganic layer 319, and an organic layer 320 may be alternately stacked. For example, the first inorganic layer 318, the organic layer 320, and the second inorganic layer 319 may be sequentially stacked on the organic light-emitting display device OLED. Various modifications may be made to the stacked structure of an inorganic layer and an organic layer provided in the TFE layer 130.

The functional film 140 may be arranged on the TFE layer 130. For example, a touch screen layer 141 may be arranged on the TFE layer 130. According to some embodiments, the touch screen layer 141 may include an electrostatic capacitive type touch screen. For example, a base layer may be arranged on the TFE layer 130. A plurality of lines for touch electrodes may be arranged on the base layer. According to some embodiments, the lines for touch electrodes may have a structure in which a Ti layer, an Al layer, and another Ti layer are stacked. In another example, the base layer may be omitted in the touch screen layer 141. The lines for touch electrodes may covered with an insulating layer for touch electrodes. The insulating layer for touch electrodes may include an organic layer or an inorganic layer.

A polarizing layer 142 and a cover member 143 may be arranged on the touch screen layer 141 described above.

The polarizing layer 142 may include a retarder and/or a polarizer. A retarder may be of a film type or a liquid crystal coating type and may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a certain arrangement. Each of the retarder and the polarizer may further include a protective film.

The cover member 143 may include a transparent material such as glass, plastic, or the like. In this case, the cover member 143 may transmit light and absorb an external shock.

A first insulating layer 331 may be arranged on the substrate 301 in a pad area. The first insulating layer 331 may be arranged on a same layer as the barrier layer 302. In other words, the first insulating layer 331 may include a same material as the barrier layer 302 in a same process.

A second insulating layer 332 may be arranged on the first insulating layer 331. The second insulating layer 332 may be arranged on a same layer as the gate insulating layer 307. In other words, the second insulating layer 332 may include a same material as the gate insulating layer 307 in a same process.

A first conductive layer 410 provided in each pad terminal 400 may be arranged on the second insulating layer 332. The first conductive layer 410 may be electrically connected to a line 113 withdrawn from the display area DA. The first conductive layer 410 may be arranged on a same layer as the gate electrode 308. In other words, the first conductive layer 410 may include a same material as the gate electrode 308 in a same process. The first conductive layers 410 may be arranged to be apart from each other in one direction of the substrate 301.

A third insulating layer 333 may be arranged on the first conductive layer 410. The third insulating layer 333 may be arranged on a same layer as the interlayer insulating layer 309. The third insulating layer 333 may include a same material as the interlayer insulating layer 309 in a same process. According to some embodiments, the third insulating layer 333 may include an organic layer or an inorganic layer.

The third insulating layer 333 may cover at least a portion of the first conductive layer 410. A contact hole 431 may be provided on the first conductive layer 410 by removing a portion of the third insulating layer 333. An upper surface of the first conductive layer 410 may be exposed to the outside in an area defined by the contact hole 431.

A second conductive layer 420 may be arranged on the first conductive layer 410. The second conductive layer 420 may be arranged on the first conductive layer 410 in an island shape. According to some embodiments, the second conductive layer 420 may be electrically connected to the line 113 withdrawn from the display area DA.

The second conductive layer 420 may be arranged on a same layer as the source electrode 310 and the drain electrode 311. In other words, the second conductive layer 420 may be formed of a same material in a same process as that of the source electrode 310 and the drain electrode 311. According to some embodiments, the second conductive layer 420 may have a structure in which a plurality of layers including at least one of Al or Ti are stacked. The stacked structure of the second conductive layer 420 may have various embodiments such as Al/Ti/AI or Ti/Al/Ti. In this case, the second conductive layer 420 is not limited thereto and may include various materials and various structures.

Referring to FIG. 3, the second conductive layer 420 may be electrically connected to the first conductive layer 410 through the contact hole 431. In other words, the second conductive layer 420 may be electrically connected to the first conductive layer 410 in an area in which the third insulating layer 333 is not present. The first conductive layer 410 and the second conductive layer 420 may include a contact portion in an area where the contact hole 431 is arranged.

The second conductive layer 420 may extend over a partial area exposed through the contact hole 431 and an area in which the third insulating layer 333 covering the first conductive layer 410 is arranged.

The first conductive layer 410 and the second conductive layer 420 may not be electrically connected over the entire area, but may be connected through the contact hole 431 provided by removing a portion of the third insulating layer 333. A portion of the second conductive layer 420 may be arranged in an area of the first conductive layer 410 exposed through the contact hole 431, and the other portion of the second conductive layer 420 may be arranged on the third insulating layer 333.

The driving terminal 52-1 may be electrically connected to the pad terminal 400. A circuit pattern may be arranged below the display driving unit 52. A terminal insulating layer may cover a portion of the circuit pattern. The driving terminal 52-1 may be electrically connected to the circuit pattern. The driving terminal 52-1 may include at least one of gold (Au), nickel (Ni), or tin (Sn). Embodiments according to the present disclosure are not limited thereto, however, and the driving terminal 52-1 may include any suitable conductive material.

The driving terminal 52-1 may extend over an area in which the first conductive layer 410 and the second conductive layer 420 are electrically connected, and an area in which the first conductive layer 410 and the second insulating layer 332 are apart from each other with the third insulating layer 333 therebetween.

According to some embodiments, the first conductive layer 410 and the second conductive layer 420 may be arranged on the same layer as other metal layers arranged on the substrate 301 in FIG. 3, for example, a metal layer selected from among the first electrode 313, the second electrode 315, and the touch electrode 322, in addition to the gate electrode 308, the source electrode 310, and the drain electrode 311.

According to some embodiments, the third insulating layer 333 may be arranged on a same layer as an insulating layer selected from among the gate insulating layer 307, the pixel-defining layer 316, the TFE layer 130, and the insulating layer for touch electrodes, patterned on the substrate 301 in FIG. 3, in addition to the interlayer insulating layer 309.

The plurality of pad terminals 400 electrically connected to the driving terminal 52-1 may be arranged in the pad area. Each of the pad terminals 400 of the plurality of pad terminals 400 may be arranged to be apart from each other in one direction of the substrate 301.

Because the overall stress of the display panel 110 as described above approaches 0, the display panel 110 may not be distorted or deformed even when used for a long time.

In addition, because the display panel 110 includes the substrate 301 of a single layer, a long-term afterimage may be improved by about 34% compared to using a substrate having a plurality of layers. Thus, the display panel 110 may realize clear image quality even when an image is changed or used for a long time.

Figure 4A:
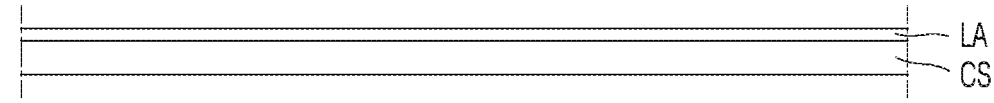
FIGS. 4A to 4D are cross-sectional views illustrating a manufacturing procedure for the display device shown in FIG. 1A or 2A.
Figure 4A:
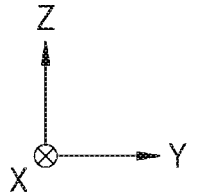

FIG. 4A is a cross-sectional view illustrating a manufacturing procedure of the display device shown in FIG. 1A or 2A.

Referring to FIG. 4A, after a carrier substrate CS is prepared, a lower reinforcement layer LA may be provided on the carrier substrate CS. In this case, the lower reinforcement layer LA may be provided on a side of the carrier substrate CS through a chemical vapor deposition method. In addition, the lower reinforcement layer LA may be a same as or similar to the reinforcement layer 301-1 described with reference to FIG. 3.

Figure 4B:
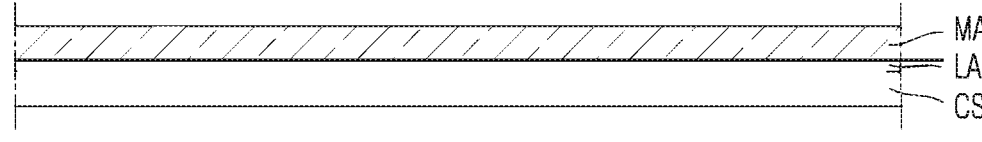
Figure 4B:
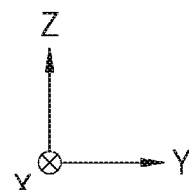

FIG. 4B is a cross-sectional view illustrating a manufacturing procedure of the display device shown in FIG. 1A or 2A.

Referring to FIG. 4B, a substrate member MA may be provided on the lower reinforcement layer LA. In this case, the carrier substrate CS may include glass. In addition, the substrate member MA may include PI. In this case, the substrate member MA may be provided by supplying a resin onto the carrier substrate CS through a spin coater, a line coater, or the like, according to some embodiments. Thereafter, energy such as heat and/or light may be irradiated to the substrate member MA to cure the substrate member MA.

According to some embodiments, the substrate member MA may be provided on the carrier substrate 301 without providing the lower reinforcement layer LA. In this case, when the substrate member MA is directly provided on the carrier substrate CS, an upper reinforcement layer 301-1 to be described later may be provided on the substrate member MA.

Figure 4C:
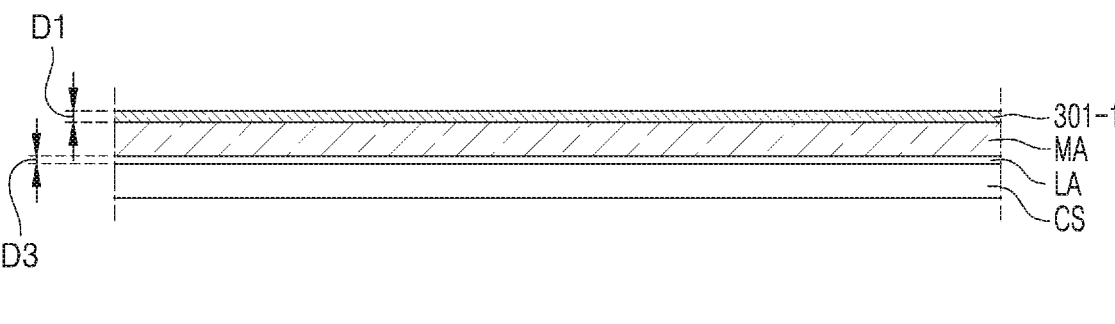
Figure 4C:
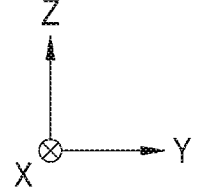

FIG. 4C is a cross-sectional view illustrating a manufacturing procedure for the display device shown in FIG. 1A or 2A.

Referring to FIG. 4C, an upper reinforcement layer 301-1 may be provided on the substrate member MA by a chemical vapor deposition method. The upper reinforcement layer 301-1 is a same as the reinforcement layer 301-1 described above with reference to FIG. 3, and redundant descriptions thereof are omitted.

A third thickness D3 of the lower reinforcement layer LA may be less than a first thickness D1 of the upper reinforcement layer 301-1. For example, the third thickness D3 of the lower reinforcement layer LA may be about 100 Å or less. When the third thickness D3 of the lower reinforcement layer LA exceeds about 100 Å, when the substrate member MA is separated from the carrier substrate CS, the substrate member MA and the lower reinforcement layer LA may not be separated, and the substrate member MA and the upper reinforcement layer 301-1 may be separated. On the other hand, when the third thickness D3 of the lower reinforcement layer LA is about 100 Å or less, the substrate member MA and the lower reinforcement layer LA may be separated, thereby minimizing or reducing a defect rate in manufacturing the display panel 110. Furthermore, when the substrate member MA and the carrier substrate CS are separated, the upper reinforcement layer 301-1 may be covalently bonded to the barrier layer 302, so that the upper reinforcement layer 301-1 and the barrier layer 302 may not be separated from each other.

Figure 4D:
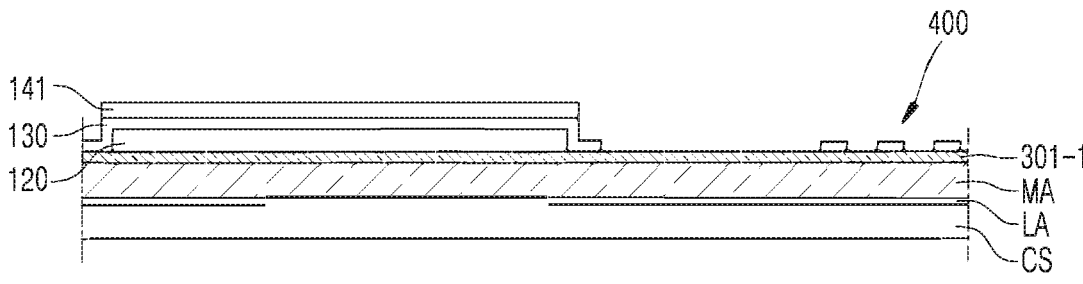
Figure 4D:
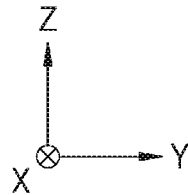

FIG. 4D is a cross-sectional view illustrating a manufacturing procedure of the display device shown in FIG. 1A or 2A.

Referring to FIG. 4D, a display layer 120 and a TFE layer 130 may be provided on the upper reinforcement layer 301-1. In this case, a pad terminal 400 may be provided or formed simultaneously or concurrently when the display layer 120 is provided. In addition, a touch screen layer 141 may be provided on the TFE layer 130.

Figure 4E:
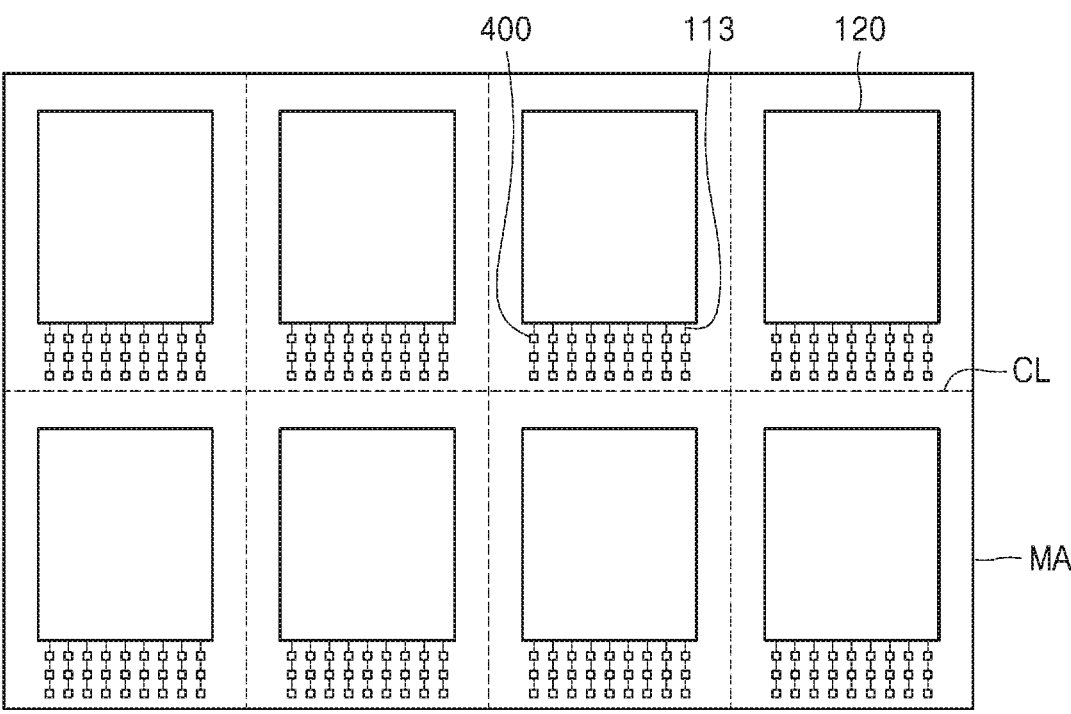
FIG. 4E is a plan view illustrating a manufacturing procedure for the display device shown in FIG. 1A or 2A.

FIG. 4E is a plan view illustrating a manufacturing procedure of the display device shown in FIG. 1A or 2A.

Referring to FIG. 4E, the substrate member MA may be separated from the carrier substrate CS. According to some embodiments, a plurality of display layers 120 may be provided on the substrate member MA to be apart from each other. In this case, the substrate member MA may cut between the display layers 120 adjacent to each other among the plurality of display layers 120. In this case, the substrate member MA may be separated into a plurality by irradiating a laser beam along a cutting line CL or applying a force to the cutting line CL through a mechanism or device such as a separate blade. In this case, one display layer 120 may be arranged on the substrate members MA separated from each other. Thereafter, the substrate members MA separated from each other may be separated from the carrier substrate CS.

For example, the cutting lines C may be respectively arranged between lateral sides of the display layer 120 adjacent to each other with reference to FIG. 4E, and between the pad terminal 400 arranged below the display layer 120 and an upper side of the display layer 120. The substrate members MA may be separated from each other along the cutting line CL.

According to some embodiments, when one display layer 120 is provided on the substrate member MA, the display layer 120 may be arranged on an entire surface of the substrate member MA. In this case, the substrate member MA may be separated from the carrier substrate CS by removing a portion of the substrate member MA at a certain distance from an edge of the display layer 120 or without removing a portion of the substrate member MA.

Hereinafter, for convenience of explanation, a case in which the plurality of display layers 120 are provided apart from one another on the substrate member MA and the substrate member MA is separated into a plurality is described in more detail.

When the substrate member MA is separated from the carrier substrate CS as described above, according to some embodiments, the lower reinforcement layer LA may be separated from the substrate member MA together with the carrier substrate CS. On the other hand, the upper reinforcement layer 301-1 may be separated from the carrier substrate CS together with the substrate 301.

When the lower reinforcement layer LA and the upper reinforcement layer 301-1 are provided as described above, the reinforcement layer 301-1 may be separated with less force than when the reinforcement layer 301-1 includes a plurality of layers. For example, when the substrate member MA has a plurality of layers does not include the lower reinforcement layer LA and the upper reinforcement layer 301-1, or when the substrate member MA has a single layer and does not include the lower reinforcement layer LA and the upper reinforcement layer 301-1, a force used to separate the substrate member MA from the carrier substrate CS may be about 1100 gram force (gf). On the other hand, according to some embodiments of the present disclosure, when the substrate member MA has a single layer and the lower reinforcement layer LA is not arranged and only the upper reinforcement layer 301-1 is provided, a force used to separate the substrate member MA from the carrier substrate CS may be about 200 gf. In addition, when the substrate member MA has a single layer and includes the lower reinforcement layer LA and the upper reinforcement layer 301-1, a force used to separate the carrier substrate CS and the substrate member MA from each other may be about 150 gf or less, for example, about 30 gf. Thus, when the substrate member MA has a single layer and includes the lower reinforcement layer LA, the force used to separate the substrate member MA from the carrier substrate CS may be less than when a previous substrate member has a plurality of layers and does not include the lower reinforcement layer LA, or when the substrate member has a single layer and does not include the lower reinforcement layer LA. In addition, when the substrate member MA has a single layer and includes not only the lower reinforcement layer LA but also the upper reinforcement layer 301-1, the force for separating the substrate member MA from the carrier substrate CS may be less than when the substrate member MA has a single layer and includes only the lower reinforcement layer LA. In this case, the force for separating the substrate member MA from the carrier substrate CS may be less when an amount of hydrogen on the upper reinforcement layer 301-1 is small.

In a case in which the reinforcement layer 301-1 includes a plurality of layers without having at least one of the lower reinforcement layer LA or the upper reinforcement layer 301-1, when the reinforcement layer 301-1 is separated from the carrier substrate CS by the force as described above, a defect rate, which is a probability that defects such as the reinforcement layer 301-1 and the carrier substrate CS are not separated or the reinforcement layer 301-1 is damaged, may be about 0.47%. In a case of the substrate member MA as a single layer that does not include at least one of the lower reinforcement layer LA or the upper reinforcement layer 301-1, when the substrate member MA is separated from the carrier substrate CS by the above force, a defect rate may be about 3.53%. On the other hand, as described above, when the substrate member MA, which is a single layer, including the lower reinforcement layer LA and the upper reinforcement layer 301-1, is separated from the carrier substrate CS by a force of about 150 gf, a defect rate may be about 1.06%. In addition, when the substrate member MA, which is a single layer, including the lower reinforcement layer LA and the upper reinforcement layer 301-1, is separated from the carrier substrate CS by a force of about 38 gf, a defect rate may be about 0%. In this case, an amount of hydrogen in the upper reinforcement layer 301-1 when the force applied when the carrier substrate CS and the substrate member MA are separated may be greater than an amount of hydrogen in the upper reinforcement layer 301-1 when the force is about 150 gf.

Thus, in a method of manufacturing a display device, even when the substrate member MA has a single layer, when the lower reinforcement layer LA is arranged, the force to separate the carrier substrate CS from the substrate member MA may be less than when the substrate member MA has a plurality of layers or when the substrate member MA has a single layer and does not include the lower reinforcement layer LA. Therefore, less energy may be used in manufacturing the display device.

In addition, in the method of manufacturing the display device, when the lower reinforcement layer LA and the upper reinforcement layer 301-1 are provided, even when the substrate member MA has a single layer, a defect rate similar to that when the substrate member MA has a plurality of layers may be ensured, and the defect rate may be kept lower, depending on an amount of hydrogen atoms contained in the upper reinforcement layer 301-1.

In the method of manufacturing the display device, when the substrate member MA has a single layer, the carrier substrate CS and the substrate member MA may be separated with less force than in a case where the lower reinforcement layer LA and the upper reinforcement layer 301-1 are not provided, and the defect rate may be reduced.

Figure 4F:
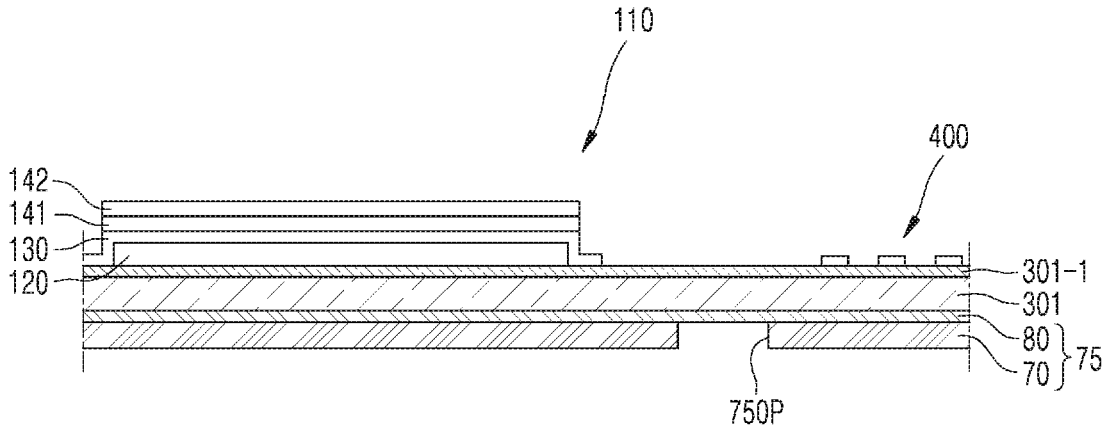
FIGS. 4F to 4K are cross-sectional views illustrating a manufacturing procedure for the display device shown in FIG. 1A or 2A.
Figure 4F:
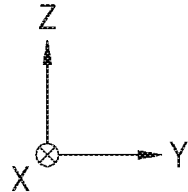

FIG. 4F is a cross-sectional view illustrating a manufacturing procedure for the display device shown in FIG. 1A or 2A.

Referring to FIG. 4F, when the substrate member MA is separated from the carrier substrate CS, the separated substrate member MA may be a single display panel 110.

A protective film 75 may be arranged on the substrate 301. In this case, the protective film 75 may include a protective film base 70 and an adhesive layer 80. In this case, an opening 75OP may be provided on the protective film 75 to correspond to the bending area BA.

In addition, a polarizing layer 142 may be arranged on the touch screen layer 141. In this case, the polarizing layer 142 may be coated on the touch screen layer 141 or attached in the form of a film.

Figure 4G:
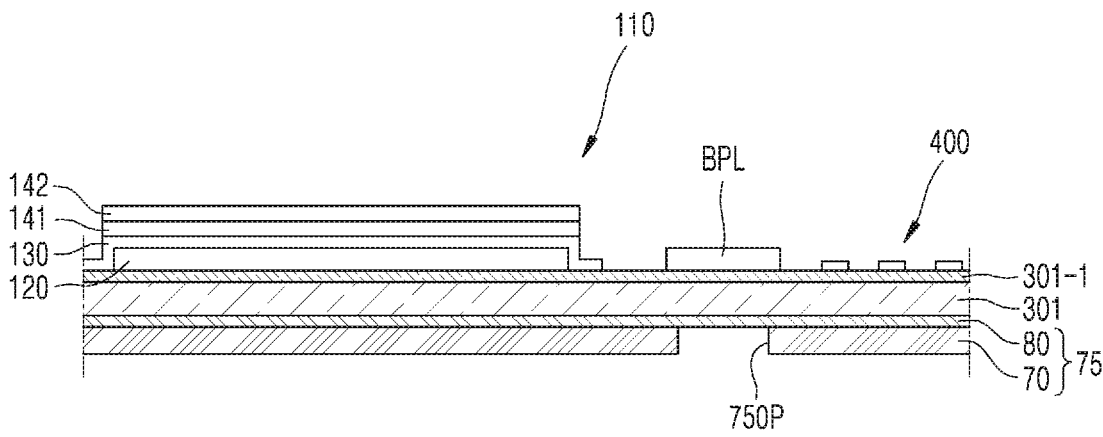
Figure 4G:
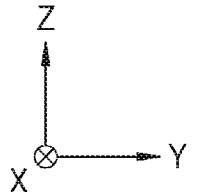

FIG. 4G is a cross-sectional view illustrating a manufacturing procedure of the display device shown in FIG. 1A or 2A.

Referring to FIG. 4G, a bending protective layer BPL may be provided on the substrate 301. In this case, the bending protective layer BPL may be arranged to correspond to the opening 75OP.

Figure 4H:
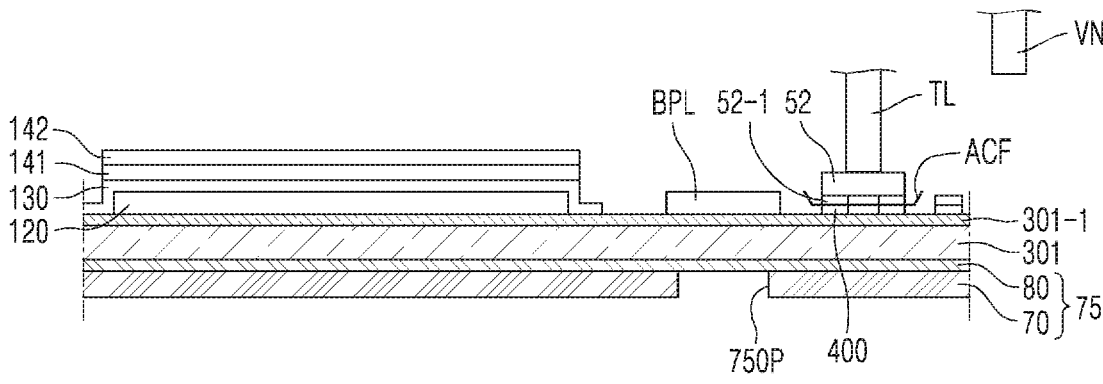
Figure 4H:
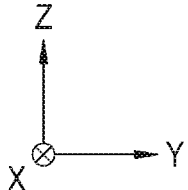

FIG. 4H is a cross-sectional view illustrating a manufacturing procedure of the display device shown in FIG. 1A or 2A.

Referring to FIG. 4H, after a display driving unit 52 is arranged to correspond to the pad terminal 400, and then, an adhesive member ACF may be arranged between the pad terminal 400 and the driving terminal 52-1. In this case, the alignment mark AR shown in FIGS. 1A and 2A may be used to measure a relative position between the display driving unit 52 and the pad terminal 400. For example, the alignment mark AR may be photographed through a vision unit VN, and a position of the pad terminal 400 may be determined based on the captured image. The display driving unit 52 may be arranged at an accurate position by adjusting a position of the display driving unit 52 based on the position of the pad terminal 400.

In such a case, it may be important for the alignment mark AR to be accurately arranged at a designed position. In this case, in a case in which the lower reinforcement layer LA is not present as described above, when the substrate 301 is separated from the carrier substrate CS, the substrate 301 may be damaged or some of the display layers 120 on the substrate 301 may be damaged. Furthermore, when the substrate 301 is separated from the carrier substrate CS, the substrate 301 may be deformed. In this case, it may be difficult to arrange the display driving unit 52 at an accurate position because the position of the alignment mark AR deviates from the designed position. For example, when the substrate 301 has a single layer, damage or deformation in the substrate 301 may be relatively more severe. However, when the lower reinforcement layer LA is provided, the above problem may not occur even when the substrate 301 has a single layer.

By applying heat and pressure to the display driving unit 52 through an attachment device TL, the pad terminal 400 and the driving terminal 52-1 may be attached to each other. In this case, the adhesive member ACF may include conductive balls and resin. Accordingly, the pad terminal 400 and the driving terminal 52-1 may be electrically connected to each other by the adhesive member ACF being melted due to the heat and pressure applied by the attachment device TL.

According to some embodiments, the attachment device TL may attach the pad terminal 400 and the driving terminal 52-1 to each other by applying vibration or ultrasonic waves to the display driving unit 52. In this case, the pad terminal 400 and the driving terminal 52-1 may be electrically connected to each other by melting. In this case, the adhesive member ACF may be provided at an attachment site after the pad terminal 400 and the driving terminal 52-1 are attached.

According to some embodiments, after arranging the adhesive member ACF between the pad terminal 400 and the driving terminal 52-1, the attachment device TL may apply vibration or ultrasonic waves to the display driving unit 52 to connect the pad terminal 400 and the driving terminal 52-1 to each other through the adhesive member ACF. In this case, the adhesive member ACF may include a resin and a conductive ball.

While the operation as described above is in progress, heat may be applied to the substrate 301. Due to this heat, the substrate 301 may be deformed. For example, a portion where the pad terminals 400 are arranged, between the pad terminals 400, around the pad terminals 400, etc. may be easily deformed by heat.

In this case, because a position of the pad terminal 400 is variable, the pad terminal 400 and the driving terminal 52-1 may not correspond to each other or may not be bonded to each other in a large area. However, by blocking the heat transfer to the substrate 301 to some extent due to the upper reinforcement layer 301-1, deformation of the substrate 301 may be minimized or reduced.

Accordingly, because the position change of the pad terminal 400 is similar to a previously designed position, the pad terminal 400 and the driving terminal 52-1 may be smoothly connected to each other. For example, in this regard, it was confirmed that when the substrate 301 has a single layer does not include the upper reinforcement layer 301-1, a defect rate when the display driving unit 52 is connected to the pad terminal 400 is about 8%, whereas when the substrate 301 has a single layer and includes the upper reinforcement layer 301-1, a defect in which the display driving unit 52 is not connected to the pad terminal 400 does not occur.

Figure 4I:
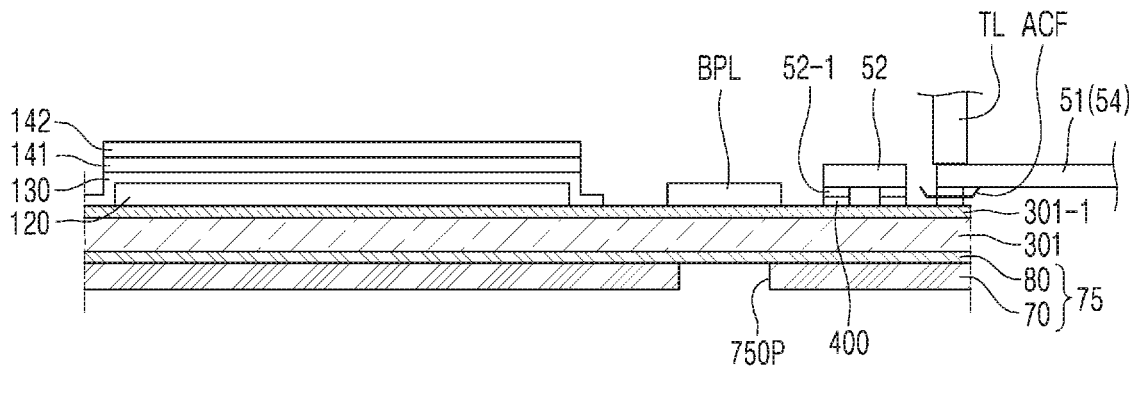
Figure 4I:
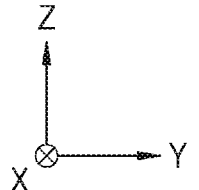

FIG. 4I is a cross-sectional view illustrating a manufacturing procedure for the display device shown in FIG. 1A or 2A.

Referring to FIG. 4I, after the display driving unit 52 is arranged on the pad terminal 400 and connected, the display circuit board 51 or the flexible film 54 may be connected to the pad terminal 400 arranged on an end of the display panel 110. In this case, the display circuit board 51 or the flexible film 54 may be aligned according to positions of the alignment marks AR shown in FIG. 1A or 2A. In this case, as described above, because a deformation of the substrate 301 is minimized or reduced due to the upper reinforcement layer 301-1, the display circuit board 51 or the flexible film 54 may be precisely aligned to correspond to the pad terminal 400 at a position similar to the previously designed position.

When the process as described above is completed, the attachment device TL may operate similarly to that described with reference to FIG. 4H. In this case, the adhesive member ACF may be arranged between the pad terminal 400 and the display circuit board 51 or between the pad terminal 400 and the flexible film 54. According to some embodiments, the adhesive member ACF may not be utilized.

Figure 4J:
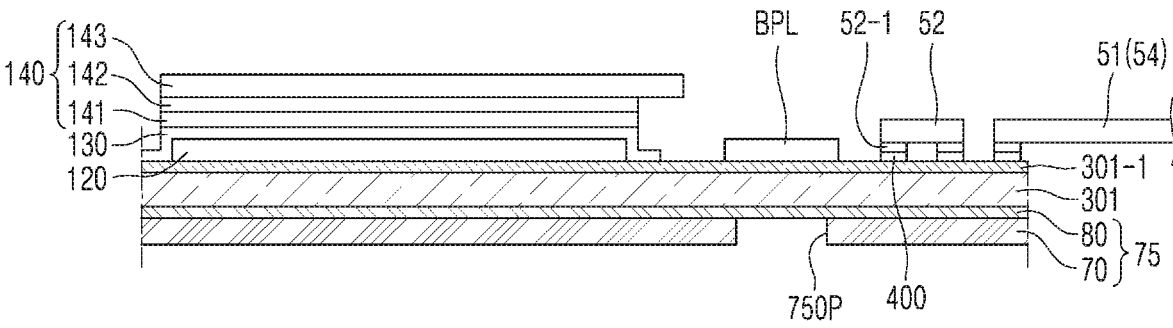
Figure 4J:
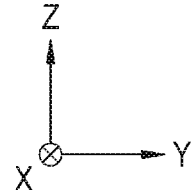

FIG. 4J is a cross-sectional view illustrating a manufacturing procedure for the display device shown in FIG. 1A or 2A.

Referring to FIG. 4J, a cover member 143 may be arranged on the polarizing layer 142. According to some embodiments, an additional adhesive member may be arranged between the polarizing layer 142 and the cover member 143. In this case, the adhesive member may be in the form of a transparent adhesive film.

Figure 4K:
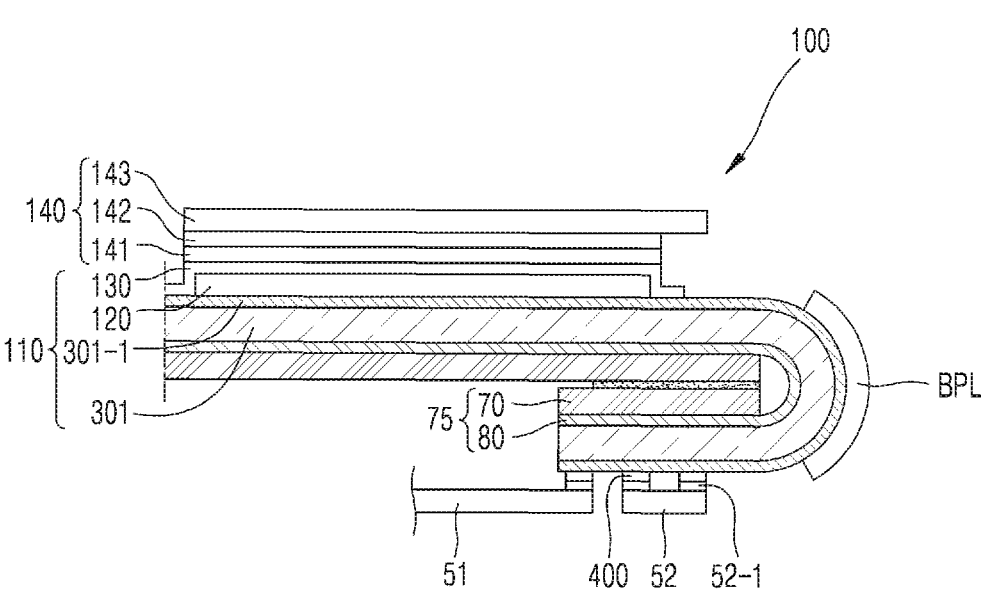

FIG. 4K is a cross-sectional view illustrating a manufacturing procedure for the display device shown in FIG. 1A or 2A.

Referring to FIG. 4K, the substrate 301 may be bent in one direction. In this case, one side of the substrate 301 on which the display layer 120 is not arranged may be bent. In this case, the surface of the substrate 301 where the display layer 120 is not arranged face each other by bending.

Thus, the display device 100 manufactured as described above may minimize or reduce defects occurring during manufacturing. In addition, the display device 100 may minimize or reduce an internal stress by minimizing or reducing the overall stress.

Figure 5:
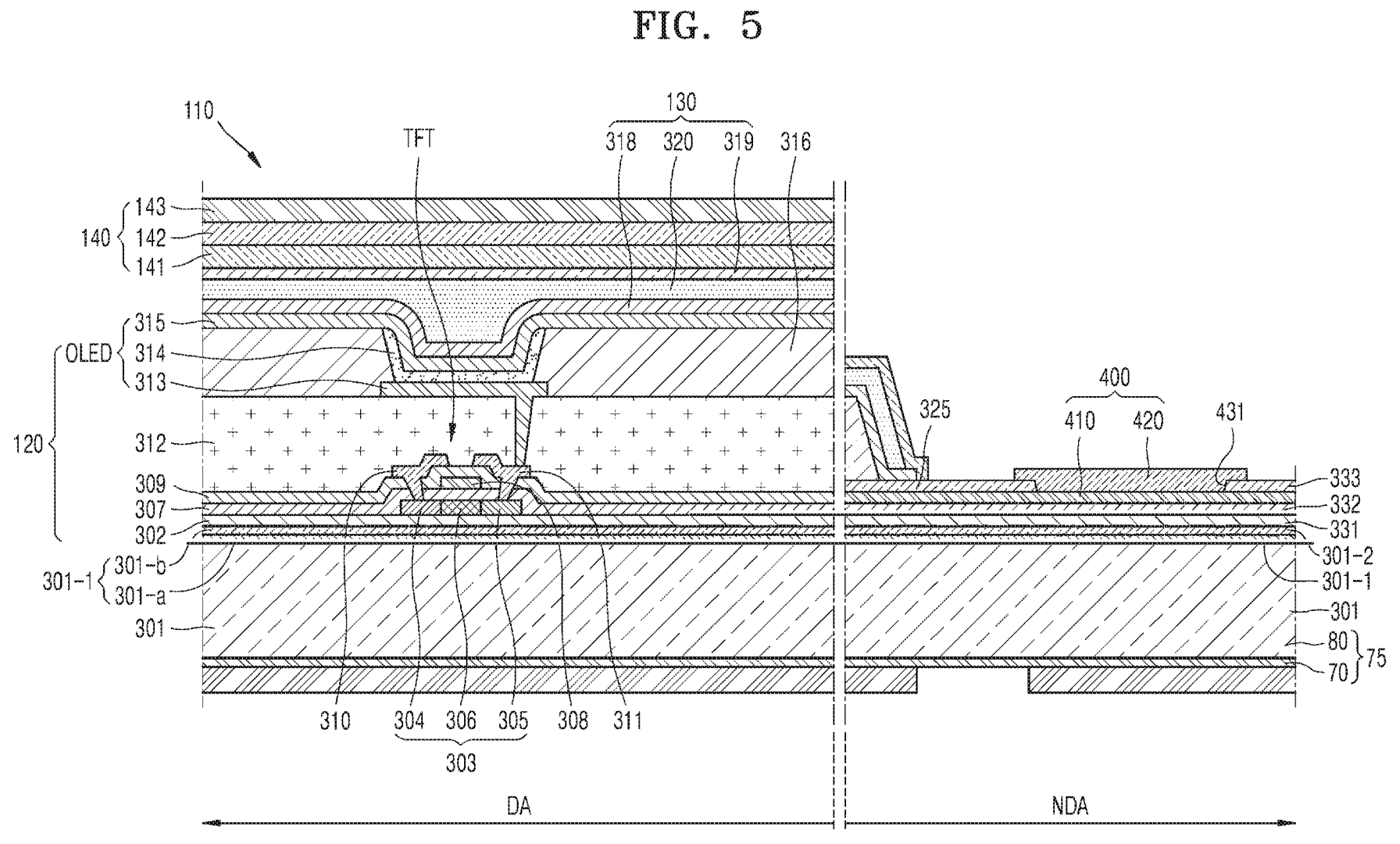

FIG. 5 is a cross-sectional view illustrating a portion of a display device according to some embodiments.

Referring to FIG. 5, a display device may include a substrate 301, a first reinforcement layer 301-1a, a second reinforcement layer 301-1b, a barrier layer 302, a semiconductor active layer 303, a gate insulating layer 307, a gate electrode 308, an interlayer insulating layer 309, a source electrode 310, a drain electrode 311, a protective layer 312, a first electrode 313, an intermediate layer 314, a second electrode 315, a pixel-defining layer 316, a TFE layer 130, a functional film 140, and a pad terminal 400. The barrier layer 302, the semiconductor active layer 303, the gate insulating layer 307, the gate electrode 308, the interlayer insulating layer 309, the source electrode 310, the drain electrode 311, the protective layer 312, the first electrode 313, the intermediate layer 314, the second electrode 315, the pixel-defining layer 316, the TFE layer 130, the functional film 140, and the pad terminal 400 are a same as or similar to those described with reference to FIG. 3, and redundant descriptions thereof are omitted.

The first reinforcement layer 301-1a and the second reinforcement layer 301-1b may be stacked together. In other words, the first reinforcement layer 301-1a may be arranged on the substrate 301, the second reinforcement layer 301-1b may be arranged on the first reinforcement layer 301-1a, and the barrier layer 302 may be arranged on the second reinforcement layer 301-1b. In this case, the first reinforcement layer 301-1a and the second reinforcement layer 301-1b may be a same as or similar to the reinforcement layer 301-1 shown in FIG. 3.

The first reinforcement layer 301-1a and the second reinforcement layer 301-1b described above may include a same material or different materials. For example, the first reinforcement layer 301-1a and the second reinforcement layer 301-1b may each include $SiO_X$ or $SiN_X$. According to some embodiments, the first reinforcement layer 301-1a may include one of $SiO_X$ and $SiN_X$, and the second reinforcement layer 301-1b may include the other one of $SiO_X$ and $SiN_X$. According to some embodiments, the first reinforcement layer 301-1a may include $SiO_X$ and $SiN_X$, and the second reinforcement layer 301-1b may include $SiO_X$ or $SiN_X$. According to some embodiments, the first reinforcement layer 301-1a may include $SiO_X$ or $SiN_X$, and the second reinforcement layer 301-1b may include $SiO_X$ and $SiN_X$.

In the above case, each of the first reinforcement layer 301-1a and the second reinforcement layer 301-1b may include at least one of a same stress range as the reinforcement layer 301-1 shown in FIG. 3, a same thickness range, a same number of hydrogen atoms per unit volume, a same ratio between a bond between silicon and hydrogen of $SiN_X$ and a bond between nitrogen hydrogen per unit volume, and a ratio between silicon and nitrogen of $SiN_X$ per unit volume.

Thus, in the above case, in the display device 100, internal stress may be minimized or reduced, so that deformation may be minimized or reduced when used for a long time. In addition, in the display device 100, deformation of the substrate 301 due to heat may be minimized or reduced.

Figure 6:
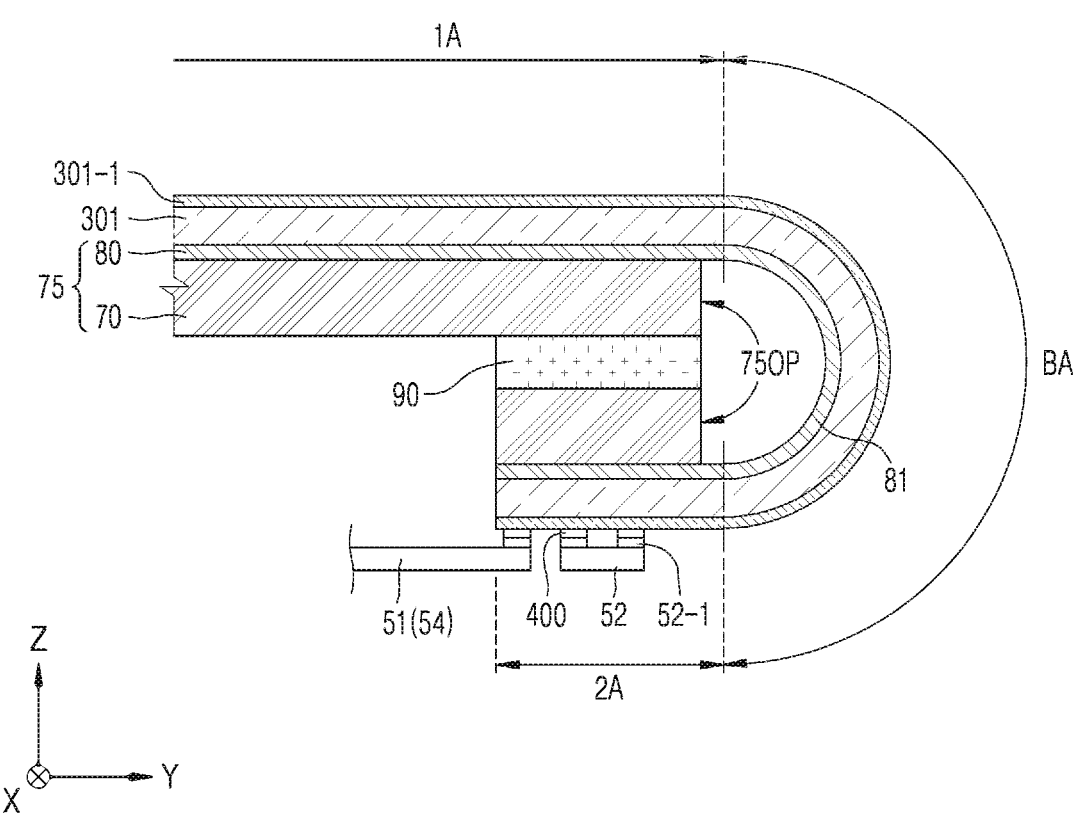
FIG. 6 is a cross-sectional view illustrating a bent state of the display device shown in FIG. 1A or 2A.

FIG. 6 is a cross-sectional view illustrating the display device shown in FIG. 1A or 2A, in a bent shape.

Referring to FIG. 6, when the display panel 110 is bent, an adhesive member 90 may be arranged on the substrate 301 of the display panel 110. In other words, the adhesive member 90 may be arranged at a portion where the substrate 301 is bent, so that a side of the first area 1A of the display panel and a side of the second area 2A of the display panel 110 are attached to each other and fixed.

According to some embodiments, a protective film 75 may be arranged on the substrate 301, and the protective film 75 in the first area and the protective film 75 in the second area 2A may be attached to each other through the adhesive member 90 to be fixed. Hereinafter, for convenience of explanation, a case in which the protective film 75 is arranged on the substrate 301 and the protective film 75 in the first area 1A and the protective film 75 in the second area 2A are attached to the adhesive member 90 is mainly described in detail.

The protective film 75 may include a protective film base 70 and an adhesive layer 80. In this case, the protective film base 70 may include polyethylene terephthalate (PET) or PI. In addition, the adhesive layer 80 may include various adhesive materials. In this case, the adhesive layer 80 may be arranged on an entire surface of the substrate 301, and after being arranged on the adhesive layer 80, the protective film base 70 may be partially removed to provide an opening 75OP. According to some embodiments, a portion of the protective film base 70 and a portion of the adhesive layer 80 may be removed to provide the opening 75OP. In this case, both the protective film base 70 and the adhesive layer 80 may not be in the opening 75OP.

The substrate 301 may be bent in the bending area BA. Because the protective film base 70 of the protective film 75 may protect a lower surface of the substrate 301, the protective film base 70 may have its own rigidity. Accordingly, when the protective film base 70 is has low flexibility, peeling may occur between the protective film base 70 and the substrate 301 as the substrate 301 is bent. However, in a case of the display device according to some embodiments, because the protective film 75 has the opening 75OP corresponding to the bending area BA, such peeling may be effectively prevented.

Hereinabove, it is described that the protective film 75 has the opening 75OP corresponding to the bending area BA, and the protective film 75 is attached to a lower surface of the substrate 301 in the first area 1A and the second area 2A, but the embodiments are not limited thereto. For example, the protective film 75 may correspond only to at least a portion of the first area 1A of the substrate 301. In other words, the protective film 75 may not be in the second area 2A of the substrate 301.

In addition, although the embodiments of the present disclosure show that the substrate 301 is bent with respect to a bending axis so that a portion of the lower surface in the first area 1A and at least a portion of the lower surface in the second area 2A face each other, the embodiments are not limited thereto. For example, various modifications may be made, such as the lower surface in the second area 2A does not face the lower surface in the first area 1A because a curvature in the bending area BA is less than shown in the drawings, or an area of the bending area BA is narrow even when there is no significant change in the curvature in the bending area.

In this case, the substrate 301 may be bent by rotating the display circuit board 51 while tension is applied to the display circuit board 51 as described above.

Figure 7:
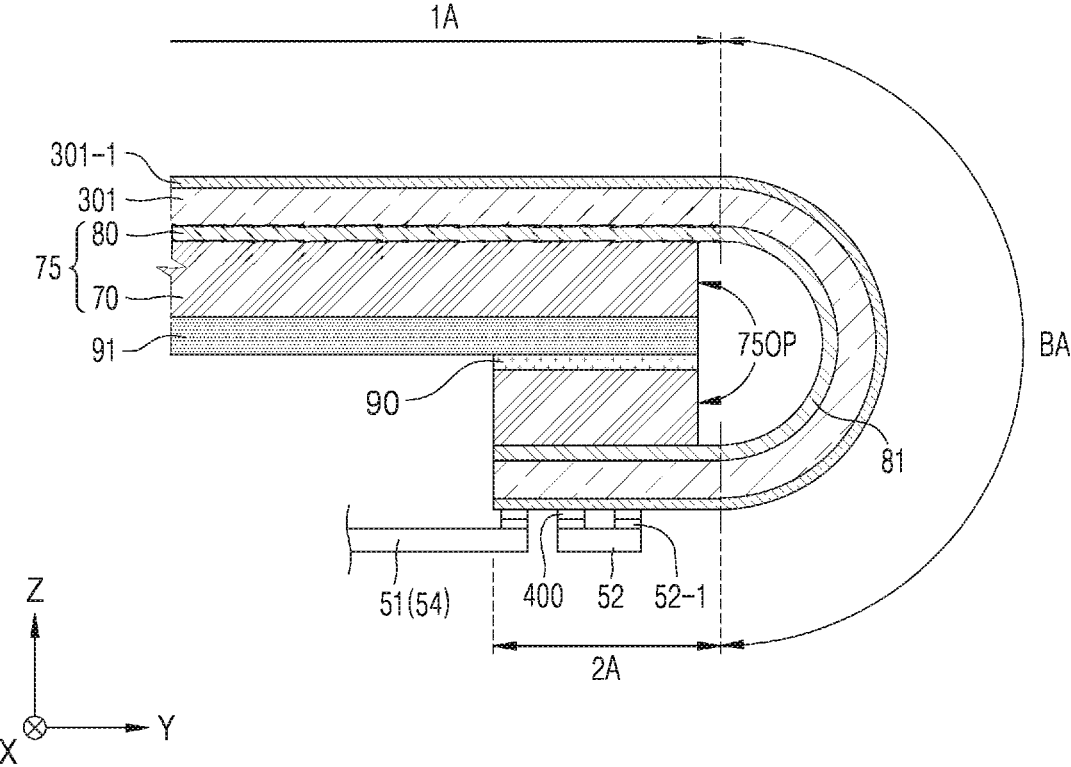
FIG. 7 is a cross-sectional view illustrating a bent state of the display device shown in FIG. 1A or 2A.

FIG. 7 is a cross-sectional view illustrating a bent state of the display device shown in FIG. 4A or 4B.

Referring to FIG. 7, after the substrate 301 or the like is bent, a cushion layer 91 may be further arranged in an area where the first area 1A and the second area 2A face each other. In other words, the cushion layer 91 in contact with a portion of the first area 1A of the protective film base 70 and the second area 2A of the protective film base 70 may be arranged. After bending the substrate 301 and the like, the cushion layer 91 may be arranged in a space where the first area 1A and the second area 2A are apart from each other, and may support the display panel and absorb shock. The cushion layer 91 may include a material having elasticity. In this case, the display device is not limited thereto, and the cushion layer 91 may be attached to the protective film base 70 before bending.

In the above case, the adhesive member 90 may be arranged between the cushion layer 91 and the protective film base 70 of the second area 2A to fix the cushion layer 91 and the protective film base 70.

In such a case, the substrate 301 may be bent by rotating the display circuit board 51 while tension is generated in the display circuit board 51 as described above.

Figure 8:
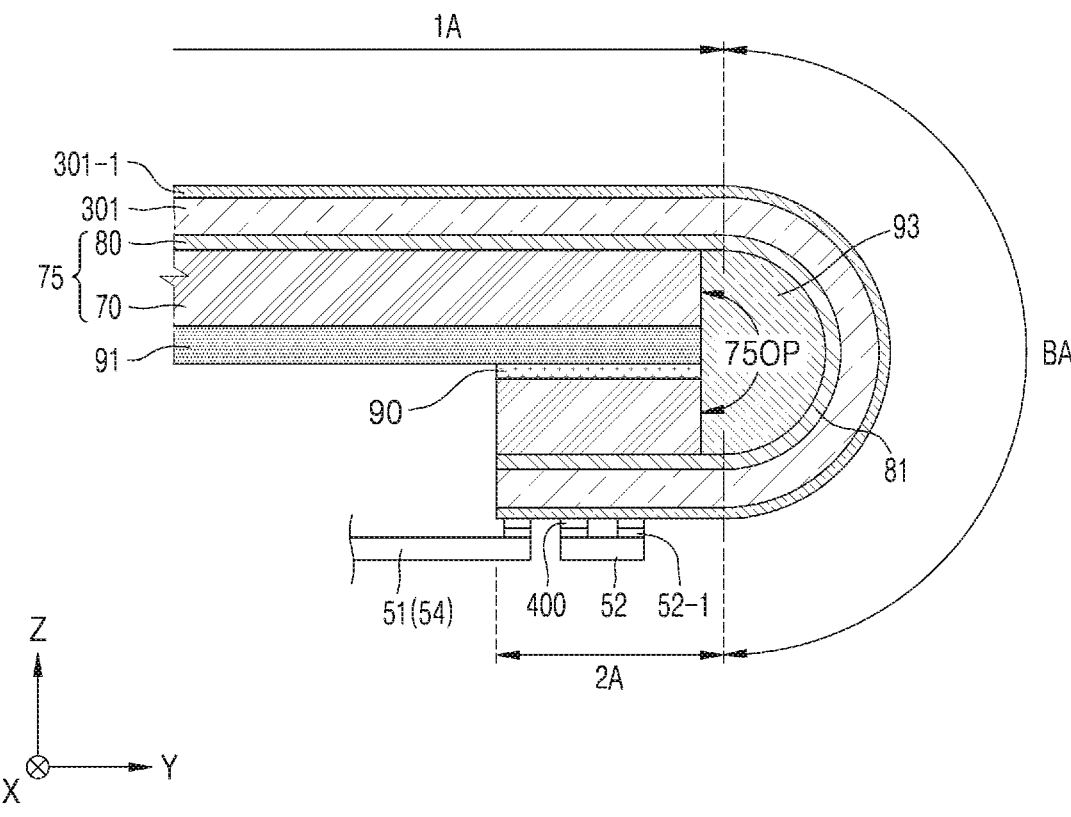
FIG. 8 is a cross-sectional view illustrating a bent state of the display device shown in FIG. 1A or 2A.

FIG. 8 is a cross-sectional view illustrating a bent state of the display device shown in FIG. 1A or 2A.

Referring to FIG. 8, a display device may further include a filler 93 in the opening 75OP portion. The filler 93 may be used together with the cushion layer 91. In this case, the filler 93 and the cushion layer 91 may be arranged after bending. According to some embodiments, the substrate 301 may be bent after arranging the filler 93 and the cushion layer 91 before bending. The embodiments are not limited thereto, and the filler 93 and the cushion layer 91 may be arranged in various ways.

The adhesive member 90 may be arranged on the cushion layer 91 as described above and fixed to the protective film base 70 of the second area 2A by the adhesive member 90.

In this case, as described above, the substrate 301 may be bent by rotating the display circuit board 51 while tension is applied to the display circuit board 51 as described above.

A display device according to the embodiments of the present disclosure may operate precisely.

In the method of manufacturing the display device according to the embodiments of the present disclosure, damage or deformation of the substrate may be minimized or reduced.

In the method of manufacturing the display device according to the embodiments of the present disclosure, a defect rate during manufacturing of the display device may be minimized or reduced.

It should be understood that embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope included in the following claims, and their equivalents.

What is claimed is:

1. A display device comprising:
a substrate having a tensile force;
a reinforcement layer on the substrate; and
a display layer comprising a barrier layer on the reinforcement layer,
wherein a number of hydrogen atoms of the reinforcement layer per unit volume is less than a number of hydrogen atoms of the barrier layer per unit volume such that the reinforcement layer has a compressive force offsetting the tensile force of the substrate.

2. The display device of claim 1, wherein the reinforcement layer has a stress resistance of 650 MPa or less.

3. The display device of claim 1, wherein a number of hydrogen atoms contained in the reinforcement layer per unit volume is $6.42 \times 10^{20}$ or less.

4. The display device of claim 1, wherein the reinforcement layer comprises a silicon oxide.

5. A display device comprising:
a substrate having a tensile force;
a reinforcement layer on the substrate; and
a display layer comprising a barrier layer on the reinforcement layer,
wherein the reinforcement layer comprises a silicon nitride, and
a ratio of a bond between nitrogen and hydrogen of the silicon nitride to a bond between silicon and hydrogen per unit volume is 22 or less such that the reinforcement layer has a compressive force offsetting the tensile force of the substrate.

6. The display device of claim 5, wherein a ratio of the nitrogen to the silicon per unit volume is 1.1 or less.

7. The display device of claim 1 or 5, wherein the reinforcement layer comprises:

a first reinforcement layer on the substrate; and a second reinforcement layer between the first reinforcement layer and the barrier layer.

8. The display device of claim 1 or 5, wherein a thickness of the reinforcement layer is 5,000 Å or less.

9. The display device of claim 1 or 5, wherein a thickness of the reinforcement layer is less than a thickness of the barrier layer.

\* \* \* \* \*